(12) United States Patent
Hatanaka et al.

(10) Patent No.: US 6,587,008 B2
(45) Date of Patent: Jul. 1, 2003

(54) PIEZOELECTRIC OSCILLATOR AND A METHOD FOR MANUFACTURING THE SAME

(75) Inventors: Hidefumi Hatanaka, Kokubu (JP); Masaru Morimoto, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/960,450

(22) Filed: Sep. 20, 2001

(65) Prior Publication Data

US 2002/0036546 A1 Mar. 28, 2002

(30) Foreign Application Priority Data

Sep. 22, 2000 (JP) ........................... 2000-289644
Sep. 22, 2000 (JP) ........................... 2000-289645
Sep. 22, 2000 (JP) ........................... 2000-289646
Sep. 22, 2000 (JP) ........................... 2000-289647

(51) Int. Cl.$^7$ ............................... H03B 1/00; H03B 5/04
(52) U.S. Cl. .................. 331/68; 331/116 R; 331/158; 331/108 C; 257/784; 257/786; 257/758; 333/191; 333/192
(58) Field of Search ...................... 331/68, 158, 116 R, 331/108 C; 310/315, 311, 321; 333/191, 192; 257/758, 784, 786

(56) References Cited

U.S. PATENT DOCUMENTS 5,172,077 A * 12/1992 Funada .................. 331/67
6,229,404 B1 * 5/2001 Hatanaka ................ 331/68

FOREIGN PATENT DOCUMENTS

| JP | 61-182098 | 11/1986 |
|----|-----------|---------|
| JP | 64-084727 | 3/1989  |
| JP | 03-201805 | 9/1991  |
| JP | 04-117706 | 4/1992  |
| JP | 06-029743 | 2/1994  |
| JP | 06-296111 | 10/1994 |
| JP | 07-336179 | 12/1995 |

(List continued on next page.)

OTHER PUBLICATIONS

Kenichi ITO "The Earth and Noise–An Overpass cannot be constructed only by IC", chapter 9.6; Japan, Nikkan Kogyo Shinbun–sha, published on Apr. 30, 1974, pp. 180–182, Fig. 9.11(c).

Primary Examiner—Arnold Kinkead
(74) Attorney, Agent, or Firm—Hogan & Hartson, LLP

(57) ABSTRACT

A piezoelectric oscillator is provided with a container unit in which an upper cavity and a lower cavity are partitioned by a partition wall, a piezoelectric oscillating element accommodated in the upper cavity, an IC chip and electronic components accommodated in the lower cavity and forming an oscillating circuit, and external terminals provided at the periphery of the bottom surface of the container unit and connected with the oscillating circuit. A jitter reducing structure for reducing jitter components of an oscillation wave outputted from the output terminal which is an external terminal electrode is formed in the partition wall of the container unit. There can be provided a small-size piezoelectric oscillator which has an excellent jitter characteristic of an oscillation waveform and can stably and satisfactorily perform high-frequency oscillation utilizing overtone oscillation, and whose characteristic is easily changeable to provide excellent versatility and noise resistance.

14 Claims, 23 Drawing Sheets

FOREIGN PATENT DOCUMENTS

| | | |
|---|---|---|
| JP | 08-000383 | 2/1996 |
| JP | 08-078955 | 3/1996 |
| JP | 08-153759 | 6/1996 |
| JP | 08-242047 | 9/1996 |
| JP | 09-284050 | 10/1997 |
| JP | 10-022734 | 1/1998 |
| JP | 11-186850 | 7/1999 |
| JP | 2000-013141 | 1/2000 |
| JP | 2000-049560 | 2/2000 |
| JP | 2000-077941 | 3/2000 |
| JP | 2000-077942 | 3/2000 |
| JP | 2000-077943 | 3/2000 |
| JP | 2000-101349 | 4/2000 |
| JP | 2000-124737 | 4/2000 |
| JP | 2000-151283 | 5/2000 |
| JP | 2000-165145 | 6/2000 |

* cited by examiner

OSCILLATING DIRECTION
OF ULTRASONIC WAVE
→

ELONGATING DIRECTION
OF WIRE
→

ELONGATING
DIRECTION
OF WIRE
↓

OSCILLATING DIRECTION
OF ULTRASONIC WAVE
→

PIEZOELECTRIC OSCILLATOR AND A METHOD FOR MANUFACTURING THE SAME

BACKGROUND OF THE INVENTION

This invention relates to a piezoelectric oscillator accommodating a piezoelectric oscillating element in a cavity of a container unit and particularly to a piezoelectric oscillator suited to high-frequency oscillation utilizing overtone oscillation. Here, piezoelectric oscillating elements include those using a crystal substrate, a piezoelectric ceramic substrate and a monocrystalline piezoelectric substrate.

A crystal oscillator as an example of the piezoelectric oscillator is mounted in a mobile communication controller or a controller for controlling a LAN and is a very important component for generating an oscillation frequency for controlling such a controller. For example, the crystal oscillator used in the mobile communication controller or the like is required to extremely reduce its volume as the mobile communication controller is becoming smaller.

As a surface mount crystal oscillator for accomplishing such a miniaturization, for example, Japanese Unexamined Patent Publication No. 10-28024 discloses a construction in which a crystal oscillating element is mounted on the surface of a container unit comprised of a rectangular single-plate substrate and a frame-shaped leg portion and having a cavity whose opening is rectangular formed in its bottom surface, and a crystal oscillating element is mounted on the outer surface of the container unit while an IC chip is mounted in the cavity of the container unit.

FIGS. 23 to 26 show such a conventional surface mount crystal oscillator 150.

This crystal oscillator 150 is mainly comprised of a container unit 151, a rectangular crystal oscillating element 152, an IC chip 153 forming an oscillation control circuit, and a metallic lid 154.

This crystal oscillator 150 uses the container unit 151 in which a rectangular single-plate ceramic substrate 155 and a frame-shaped leg portion 156 are assembled into a unit, and a cavity 157 is formed in the bottom surface of this container unit 151.

The ceramic substrate 155 partitioning the outer surface of the container unit 151 and the bottom surface of the cavity 157 is formed with via hole conductors 158 for electrically connecting the outer surface of the ceramic substrate 155 and the bottom surface of the cavity 157. A sealing conductive pattern 159 for sealing the metallic lid 154 is formed on the outer surface of the ceramic substrate 155. Further, a wiring pattern 160 including IC electrode pads is formed on the bottom surface of the cavity 157, and external terminal electrodes 161 to 164 are formed on the four corners of the bottom surface of the frame-shaped leg portion 156.

The rectangular crystal oscillating element 152 is bonded on the outer surface of the container unit 151 via crystal oscillating element mounts 169, 170 using conductive adhesive materials 171, 172 so as to be electrically conductive. Further, the saucer-shaped metallic lid 154 is integrally joined using the sealing conductive pattern 159 in order to hermetically seal the crystal oscillating element 152. The IC chip 153 is accommodated in the cavity 157. This IC chip 153 is connected with the IC electrode pads as part of the wiring pattern 160 via bumps or bonding wires. The crystal oscillating element 152 mounted on the outer surface of the container unit 151 is connected with the IC chip 153 via the via hole conductors 158, and the IC chip 153 is connected with the external terminal electrodes 161 to 164 via the wiring pattern 160. A filling resin 173 is filled into the cavity 157 and cured therein. Thus, the IC chip 153 is completely covered by the filling resin 173 to have an improved humidity resistance.

However, the aforementioned conventional crystal oscillator is a relatively low-frequency oscillator used in an oscillation frequency band of a fundamental wave, e.g., a frequency band of about 13 MHz to 28 MHz. Thus, in the case of assuming a LAN 90 constructing a giga-bit ether net as shown in FIG. 27 for performing a high-speed communication processing of a large quantity of communication information including data such as sounds, still images and animated images, the communication controller using such a crystal oscillator has a problem in communication ability.

Specifically, in a network group A, a plurality of information terminals 91 provided with a communication ability of 10 Mbps are connected with a giga-bit ether net switch 95 via hubs 93. A plurality of information terminals 92 provided with a communication ability of 100 Mbps are connected with a giga-bit ether net switch 95A via 100M repeaters 94. The gaga-bit ether net switch 95A is connected with a server 96 provided with a communication ability of 1000 Mbps. Network groups B, C are similarly constructed. A gaga-bit ether net switch 95B of the network group B is connected with the gaga-bit ether net switch 95A via a router 97, whereas a gaga-bit ether net switch 95C of the network group C is connected with the gaga-bit ether net switch 95A via a router 98.

In the above LAN 90, a clock frequency of about 25 MHz is used in communications at locations indicated at ○, and a clock frequency of about 125 MHz is used in communications at locations indicated at ●. The respective communication controllers necessitating a crystal oscillator for performing a high-frequency oscillation of 125 MHz is required to precisely process a huge amount of communication information of the entire network at high speeds. Further, in order to meet a demand for speeding up an information communication, crystal oscillators capable of performing high-frequency oscillation of 125 MHz or higher are becoming necessary.

On the other hand, among the characteristics of the crystal oscillator for the high-frequency oscillation used in the high-speed communication controller, a characteristic of a jitter J which is a phase variation of an oscillation waveform in every cycle t1 shown in FIG. 28 is essential in precisely processing an information.

The jitter J is described in detail. The jitter J is expressed as a total jitter TJ comprised of a jitter DJ which is a nonvariable component and a jitter RJ which is a variable component. In other words, a relationship defined by following equation (1) is satisfied:

$$TJ = DJ + 14RJ \tag{1}$$

Accordingly, the total jitter TJ can be suppressed by suppressing the jitter RJ to low level, and high-frequency oscillation utilizing overtone oscillation can be stably and satisfactorily performed. Specifically, a standard deviation σ centered at 8 ns needs to be 10 ps or lower at a clock frequency of 125 MHz.

Since the aforementioned conventional crystal oscillator 150 is not provided with such a characteristic, it has been impossible to use it, for example, in a communication controller for precisely processing a huge amount of communication information of an entire network at high speeds as mentioned above.

Further, a ground potential for grounding an oscillating circuit needs to be stable for the precise and stable oscillation. If a ground pattern takes up a larger area for this purpose, it partly overlaps a wiring pattern for connecting a piezoelectric oscillating element with the oscillating circuit. A parasitic capacity occurring at the overlapping portion makes the oscillation unstable, thereby causing a problem of reduced oscillation characteristics.

Further, in the aforementioned conventional crystal oscillator 150, when plasma cleaning is applied to the wiring pattern 160 provided in the cavity 157 as shown in FIG. 25 before the connection by wire bonding, a conductive external matter removed from the outer surface of the wiring pattern 160 is adhered to the wiring pattern 160 again, thereby disadvantageously reducing connection by wire bonding between the IC chip 153 and the wiring pattern 160.

Further, in this crystal oscillator 150, the oscillating circuit of the crystal oscillating element 152 is formed by one IC chip 153 as shown in FIG. 26. Specifically, inverters 181, 182 for oscillation, a drain capacity capacitor Cd, a gate capacity capacitor Cg and a return resistor Rf are integrated into one IC chip 153. Thus, the IC chip 153 itself needs to be newly designed and replaced in the case that the oscillation characteristic of the crystal oscillator is desired to be changed. This is disadvantageous in versatility.

Furthermore, it is extremely difficult to accomplish stable operation of the crystal oscillator only by one IC chip 153. Specifically, it is necessary to cut a high-frequency noise superimposed on a supply voltage Vcc supplied from the external terminal electrode 161 as a Vcc supply terminal to the oscillating inverter integrated into the IC chip 153. In order to deal with such a necessity, an electronic component 183 which is a large-capacity bypass capacitor Cb is, for example, used. However, since it is difficult to integrate this capacitor 183 into the IC chip 153, it is usually provided on a printed circuit board on which the crystal oscillator is mounted. In such a case, if P, Q denote a connecting portion of a Vcc line and the capacitor 183 on the printed circuit board and a Vcc supplying electrode pad of the IC chip 153 (pad connected with the external terminal electrode 161 for Vcc), respectively, a physical distance between the connecting portion P and the pad Q is long, with the result that high-frequency noise is likely to superimpose. This also complicates external circuits of the printed circuit board and necessitates more time and work to mount the capacitor 183 on the printed circuit board.

Further, in the crystal oscillator in which the electronic component is mounted in the cavity, when a conductive resin paste or the like is applied to a device electrode pad provided on a mount surface, i.e., the bottom surface of the cavity, low molecular components contained in the conductive resin paste spreads on the wiring pattern on the mount surface, i.e., so-called bleedout occurs, thereby causing a problem of reduced connection by wire bonding between the IC chip and the wiring pattern.

SUMMARY OF THE INVENTION

In view of the problems residing in the prior art, it is an object of the present invention to provide a piezoelectric oscillator which has an excellent jitter characteristic of an oscillation waveform and can stably and satisfactorily perform high-frequency oscillation utilizing overtone oscillation.

It is another object of the present invention to provide a smaller piezoelectric oscillator whose characteristics can be easily changed and which are excellent in versatility and noise resistance.

It is still another object of the present invention to provide a smaller piezoelectric oscillator which can suppress occurrence of a parasitic capacity at a wiring pattern for connecting an piezoelectric oscillating element with an oscillating circuit and a ground pattern, stabilizing a ground potential, and performing a precise and stable oscillation having an excellent noise resistance.

It is yet still another object of the present invention to provide a piezoelectric oscillator which can improve connection reliability of an IC chip and a wiring pattern by wire bonding.

It is further another object of the present invention to provide a piezoelectric oscillator method which can assure manufacturing of such a piezoelectric oscillator at a high efficiency.

According to an aspect of the present invention, a piezoelectric oscillator comprises: a container unit having a partition wall partitioning an upper cavity and a lower cavity; a piezoelectric oscillating element accommodated in the upper cavity; an IC chip and an electronic component accommodated in the lower cavity and forming an oscillating circuit; external terminals provided at a periphery of a bottom of the container unit and connected with the oscillating circuit.

The partition wall may be provided with a jitter reducing structure for reducing jitter components of an oscillation wave outputted from an output terminal of the external terminals.

Also, the oscillating circuit may oscillate utilizing an overtone of the third or higher harmonic of the piezoelectric oscillating element.

Further, it may be appreciated that the partition wall is formed by a plurality of insulating layers placed one over another, and a ground pattern is arranged between the insulating layers for grounding the oscillating circuit, and a wiring pattern is arranged on a lower principle surface of the partition wall for connecting the piezoelectric oscillating element with the oscillating circuit. The ground pattern and the wiring pattern are arranged in such a relationship as to suppress occurrence of a parasitic capacity.

According to another aspect of the present invention, a method for manufacturing a piezoelectric oscillator, comprises the steps of: forming a container unit having a partition wall partitioning an upper cavity and a lower cavity; mounting a piezoelectric oscillating element in the upper cavity; and mounting an IC chip and an electronic component in the lower cavity.

These and other objects, features and advantages of the present invention will become more apparent upon a reading of the following detailed description and accompanying drawings.

DETAILED DESCRIPTION OF THE PREFERRED EMBODIMENTS OF THE PRESENT INVENTION

The present invention has a variety of aspects. As an aspect, a piezoelectric oscillator comprises a container unit in which an upper cavity and a lower cavity are partitioned by a partition wall; a piezoelectric oscillating element accommodated in the upper cavity; an IC chip and electronic components accommodated in the lower cavity and forming an oscillating circuit; external terminals provided at the periphery of the bottom surface of the container unit and connected with the oscillating circuit; and a jitter reducing structure for reducing jitter components of an oscillation wave outputted from an output terminal of the external terminals.

With this construction, the IC chip is protected from noise by the jitter reducing structure formed in the partition wall of the container unit separating the piezoelectric oscillating element and the IC chip, thereby enabling reduction of the jitter components of the oscillation wave outputted from the output terminal of the external terminals. Thus, stable and satisfactory high-frequency oscillation utilizing overtone oscillation can be performed.

Why high-frequency oscillation can be stably and satisfactorily performed if overtone oscillation is utilized is described in detail. In an oscillating circuit whose capacity is added in series to a piezoelectric oscillating element, an oscillation frequency f is known to satisfy relationships defined by following equations (2) and (3):

$$f=f0(1+1/\{2\gamma(1+CL/C0)\}) \quad (2)$$

$$\gamma=C0/C1 \quad (3)$$

where f0: series resonant frequency of piezoelectric oscillating element

C0: parallel equivalent capacity of piezoelectric oscillating element

C1: series equivalent capacity of piezoelectric oscillating element

γ: capacity ratio

CL: load capacity of piezoelectric oscillating element.

Further, a frequency variation Δf satisfies a relationship defined by following equation (4) obtained from equation (2).

$$\Delta f=f-f0=f0/\{2\gamma(1+CL/C0)\} \quad (4).$$

Figure 21:
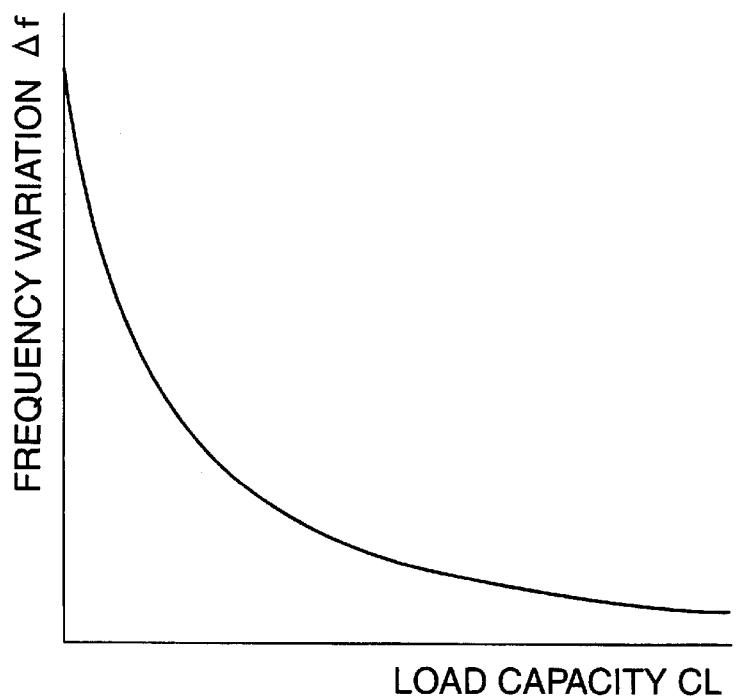
FIG. 21 is a graph showing a relationship between a frequency variation Δf and a load capacity CL during oscillation by a fundamental wave.

In the case of a fundamental wave, the frequency variation Δf and the load capacity CL show such a characteristic that the frequency variation Δf is larger in an area where the load capacity CL is smaller as shown in FIG. 21.

Figure 22:
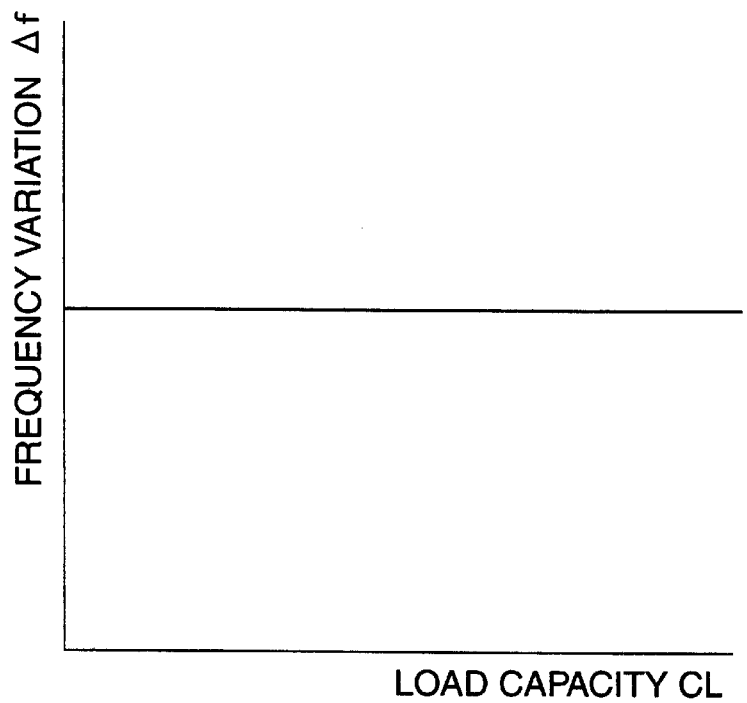
FIG. 22 is a graph showing a relationship between the frequency variation Δf and the load capacity CL during oscillation by an overtone.
Figure 23:
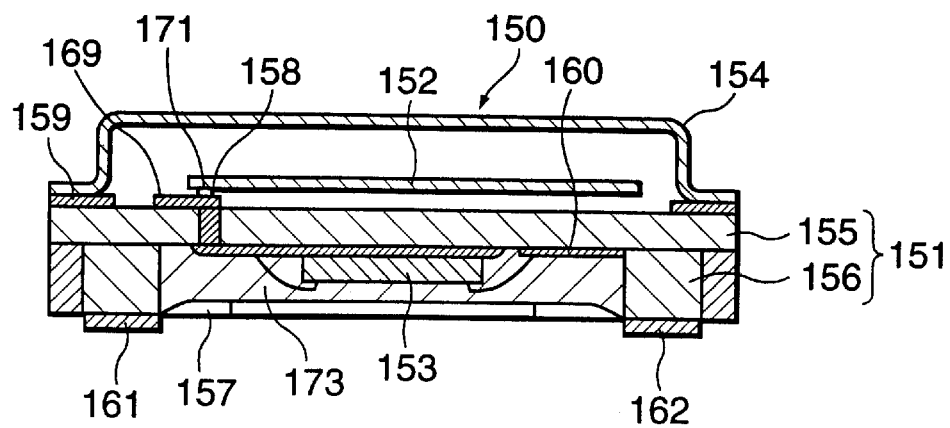
FIG. 23 is a section showing a construction of a conventional surface mount crystal oscillator.
Figure 24:
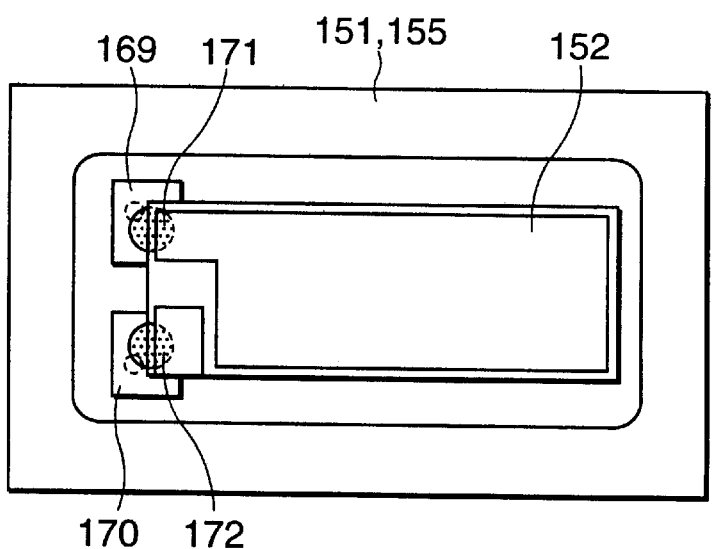
FIG. 24 is a plan view showing the conventional surface mount crystal oscillator without a lid.
Figure 25:
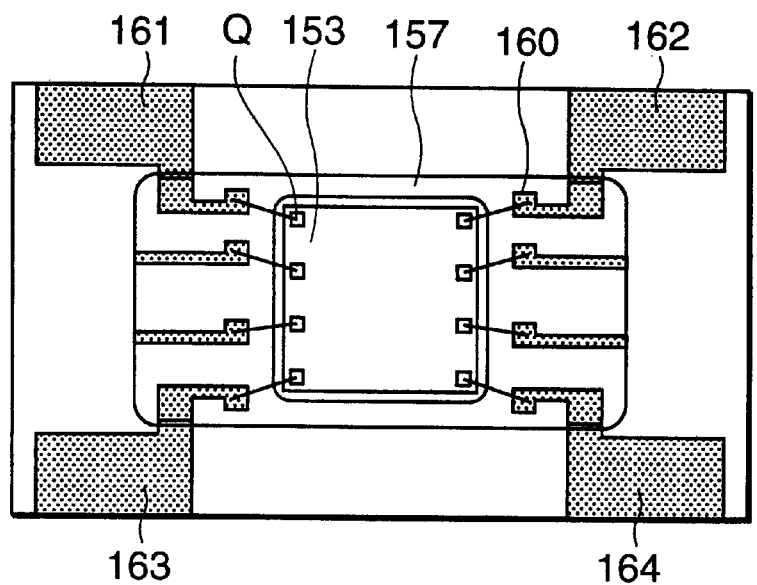
FIG. 25 is a bottom view showing the conventional surface mount crystal oscillator with a filling resin.
Figure 26:
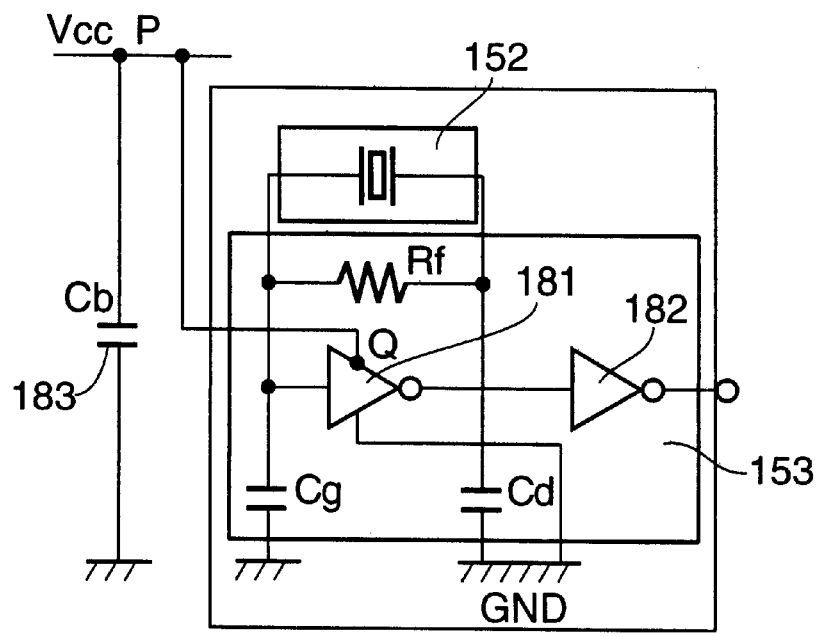
FIG. 26 is a diagram showing an oscillating circuit of the conventional surface mount crystal oscillator.
Figure 27:
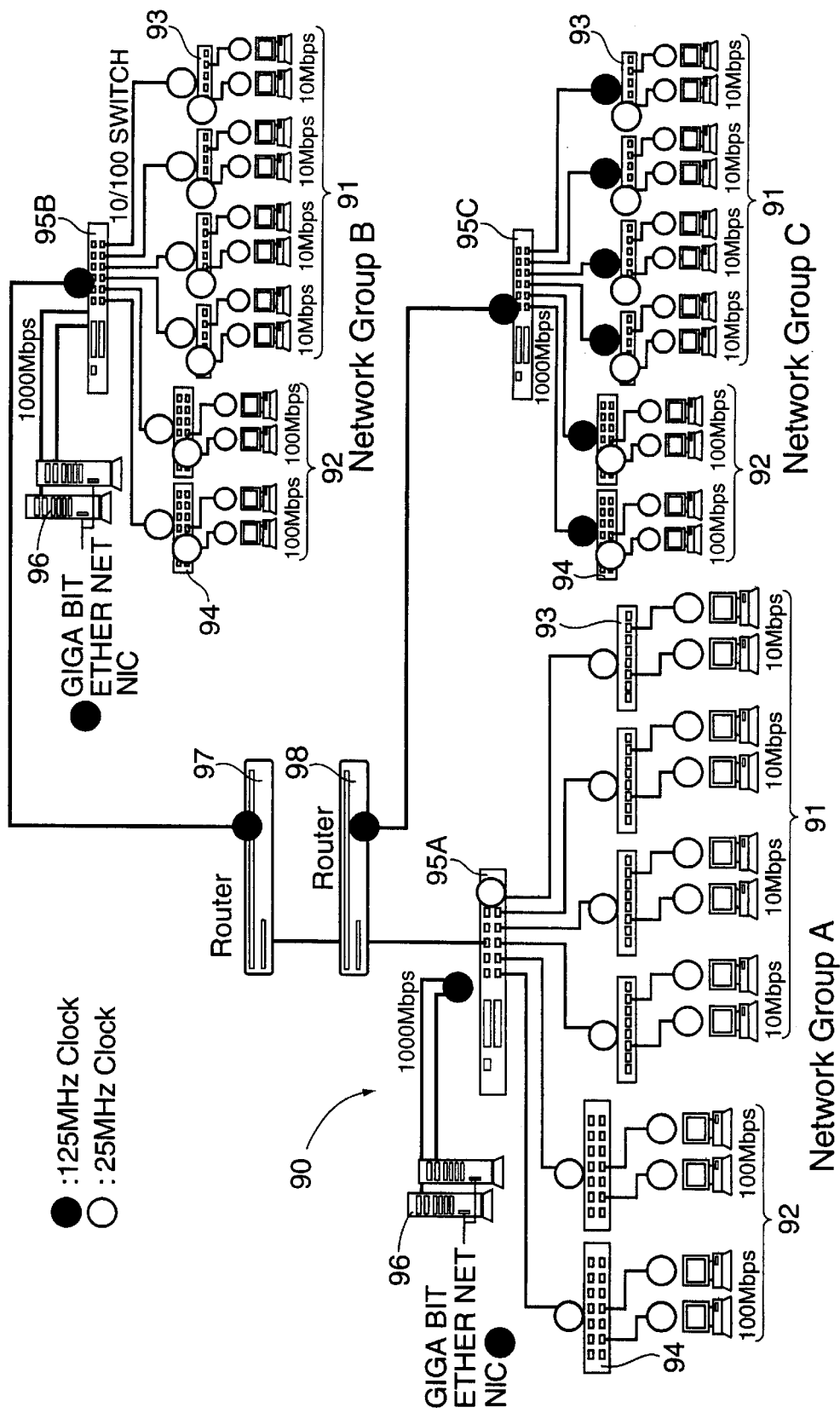
FIG. 27 is a diagram showing a construction of an LAN forming a gaga-bit ether net adopting a high-speed communication controller using a piezoelectric oscillator.
Figure 28:
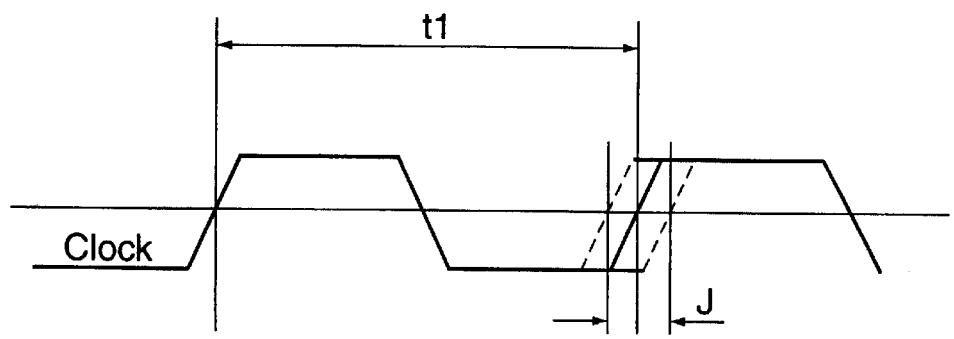
FIGS. 28 and 29 are charts showing a jitter.
Figure 29:
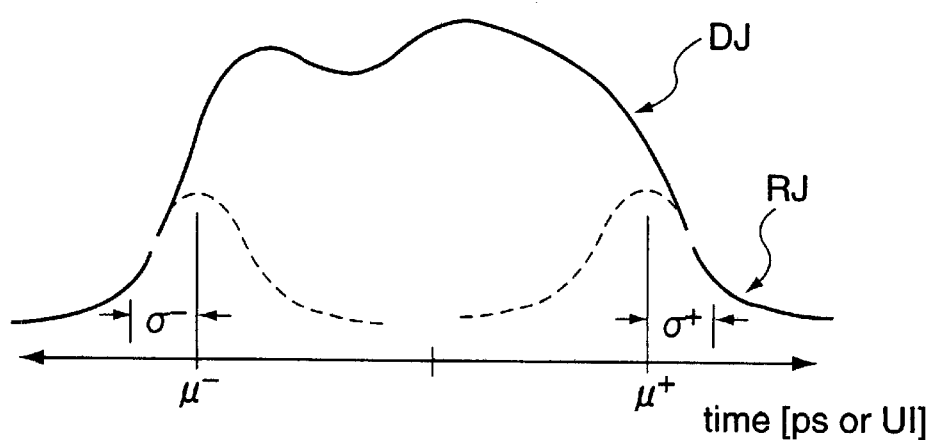

Contrary to this, the overtone oscillation of the third or higher harmonic shows such a characteristic that the frequency variation Δf is substantially constant as shown in FIG. 22 even if the load capacity CL varies.

In other words, the capacity ratio γ becomes larger (γ>1000) and the frequency variation caused by load is small in the overtone oscillation of the third or higher harmonic.

Therefore, if the overtone of the third or higher harmonic is utilized, stable and satisfactory high-frequency oscillation can be performed.

Further, in the inventive piezoelectric oscillator, the electronic components forming the oscillating circuit are not integrated into the IC chip, and the IC chip and the electronic components are independent of each other. Thus, it becomes easy to change a characteristic by suitably selecting the electronic components to set the piezoelectric oscillator at a desired characteristic, thereby improving the versatility of the piezoelectric oscillator.

Further, the piezoelectric oscillating element is accommodated in the upper cavity of the container unit partitioned by the partition wall, and the IC chip and the electronic components forming the oscillating circuit are accommodated in the lower cavity. Thus, the respective devices can be compactly arranged in a narrow space and the oscillating circuit formed by the IC chip and the like can be protected from noise. The piezoelectric oscillator can be made highly reliable and smaller and have a smaller mount surface.

Preferably, the partition wall is formed by placing a plurality of insulating layers one over another, and a ground pattern for grounding the oscillating circuit is arranged between the plurality of insulating layers as the jitter reducing structure.

With this arrangement, since the ground pattern having a large area can be formed between the insulating layers placed one over the other, a ground potential can be stabilized, and a floating capacity between the oscillating circuit and the piezoelectric oscillating element can be reduced, thereby enabling the jitter components of the oscillation wave outputted from the output terminal of the external terminal electrodes to be considerably reduced. Therefore, stable and satisfactory high-frequency oscillation can be more securely performed.

Preferably, a power supply pattern for supplying a supply voltage to the oscillating circuit is formed between the plurality of insulating layers forming the partition wall in such a manner as to be substantially surrounded by the ground pattern. With this arrangement, the IC chip can be protected from noise given from the power supply pattern by the ground pattern, and the jitter components of the oscillation wave outputted from the output terminal of the external terminals can be further reduced. Therefore, stable and satisfactory high-frequency oscillation can be even more securely performed.

Preferably, a power supply pattern including a supply electrode pad for supplying a supply voltage to the IC chip is formed and a bypass capacitor connected between the power supply pattern and part of the ground pattern is arranged in the lower cavity, and a connection point of the power supply pattern and the bypass capacitor is set in vicinity of the supply electrode pad.

With this arrangement, a length of a wiring pattern between the connection point of the power supply pattern and the bypass capacitor and the power supply electrode pad of the IC chip can be minimized. Thus, it becomes difficult for high-frequency noise having removed by the bypass capacitor to superimpose again. This enables the jitter components of the oscillation wave outputted from the output terminal of the external terminal electrodes to be considerably reduced. Therefore, stable and satisfactory high-frequency oscillation can be even more securely performed. Further, since the bypass capacitor is arranged in the lower cavity, the number of external circuits formed on a printed circuit board is reduced and wiring is simpler. Therefore, a high-performance and small-size piezoelectric oscillator can be realized.

If the oscillating circuit accommodated in the lower cavity is covered by a resin in the case that the lower cavity of the container unit is open, the oscillating circuit can be protected and its humidity resistance and heat-radiating action can be improved, with the result that it can stably operate.

If the IC chip includes a frequency divider so that an oscillation output of the piezoelectric oscillating element can be frequency-divided, one or more of outputs having a desired frequency can be obtained by frequency-dividing the oscillation output.

Also, an inventive piezoelectric oscillator comprises a container unit in which an upper cavity and a lower cavity are partitioned by a partition wall; a piezoelectric oscillating element accommodated in the upper cavity; an IC chip and electronic components accommodated in the lower cavity and forming an oscillating circuit; and external terminals provided at the periphery of the bottom surface of the container unit and connected with the oscillating circuit. The oscillating circuit oscillates utilizing an overtone of the third or higher harmonic of the piezoelectric oscillating element.

With this construction, stable and satisfactory high-frequency oscillation can be performed even if the overtone of the third or higher harmonic of the piezoelectric oscillating element is utilized by the oscillating circuit.

Another inventive piezoelectric oscillator comprises a container unit in which an upper cavity and a lower cavity are partitioned by a partition wall formed by placing a plurality of insulating layers one over another; a piezoelectric oscillating element accommodated in the upper cavity; an IC chip and electronic components accommodated in the lower cavity and forming an oscillating circuit; and external terminals provided at the periphery of the bottom surface of the container unit and connected with the oscillating circuit. A ground pattern for grounding the oscillating circuit is arranged between the insulating layers forming the partition wall of the container unit, a wiring pattern for the piezoelectric oscillating element for connecting the piezoelectric oscillating element with the oscillating circuit is arranged on a lower principle surface of the partition wall, and the ground pattern and the wiring pattern for the piezoelectric oscillating element are arranged in such a relationship as to suppress occurrence of a parasitic capacity. More specifically, the ground pattern and the wiring pattern are arranged via an insulating layer of the partition wall in such a small overlapping area as to suppress occurrence of a parasitic capacity.

With this construction, a ground potential can be stabilized by forming the ground pattern having a large area between the insulating layers forming the partition wall. Further, the wiring pattern for the piezoelectric oscillating element is arranged in such a relationship with the ground pattern as to suppress occurrence of a parasitic capacity. Since no problem resulting from a floating capacity occurs, precise and stable oscillation can be performed.

If the wiring pattern for the piezoelectric oscillating element includes a monitor electrode pad for measuring a characteristic of the piezoelectric oscillating element, the characteristic of the piezoelectric oscillating element can be measured using the monitor electrode pad while suppressing an occurrence of a parasitic capacity resulting from the monitor electrode pad.

In the inventive piezoelectric oscillator, the lower cavity is preferably partitioned into an IC cavity for accommodating the IC chip and electronic component cavities for accommodating the electronic components by a partitioning portion, and the respective components are accommodated in the corresponding cavities.

With this arrangement, even if low molecular components contained in a conductive resin paste spreads on a mount surface, i.e., so-called "bleedout" occurs when the conductive resin paste or the like is applied to the device electrode pads provided on the mount surface, i.e., the bottom surface of the cavity in the operation step of mounting the electronic components in the electronic component cavities, the influence of the bleedout can be avoided since the partitioning portion separates the electronic component cavities from the wiring pattern to be bonded to the IC chip by a wire. Therefore, connection reliability in wire bonding can be improved.

For example, if a large-capacity capacitor is arranged as an electronic component in the electronic cavity, high-frequency noise superimposed onto a supply voltage to be supplied to an oscillating inverter integrated into the IC chip can be cut, and the number of external circuits formed on the printed circuit board is reduced and wiring is simpler. Therefore, a high-performance and small-size piezoelectric oscillator can be realized.

Preferably, an IC electrode pad connected with the IC chip is arranged on the partitioning portion of the lower cavity, and the IC electrode pad and the IC chip are bonded to each other via a wire. For example, by setting the height of the IC electrode pad of the wiring pattern and that of the electrode of the IC chip substantially equal to each other, a length of connection by the wire in wire bonding can be shortened and the wire can be easily elongated even if the wiring pattern and the IC chip are bonded by the wire. Therefore, wire bonding can be more securely performed and connection reliability can be further improved.

In the case that the wiring pattern is arranged in the lower cavity, a lead wire of the wiring pattern is preferably connected by way of a via hole conductor. Specifically, since the lead wire is not exposed by being internally connected with the wiring pattern by way of the via hole conductor, a problem that external matters removed from the outer surface of the wiring pattern are adhered to the exposed lead wire can be solved in plasma cleaning which is performed prior to wire bonding. Therefore, connection reliability in wire bonding can be improved.

According to another aspect of the invention, a method for manufacturing the above-mentioned piezoelectric oscillator, comprises a piezoelectric oscillating element mounting step of mounting a piezoelectric oscillating element in the upper cavity of the container unit; and a component mounting step of mounting the IC chip and the electronic components in the lower cavity of the container unit, the piezoelectric oscillating element mounting step being performed prior to the component mounting step.

In consideration of high-frequency oscillation utilizing overtone oscillation which is likely to be influenced by external matters due to an increase in a crystal impedance value which is a resonant resistance value of the crystal oscillating element, the piezoelectric oscillating element mounting step is performed prior to the component mounting step according to the inventive manufacturing method. Accordingly, the IC chip and the electronic components are mounted in the lower cavity of the container unit using a conductive resin paste or the like after the piezoelectric oscillating element is mounted in the upper cavity of the container unit and the container unit is sealed. Thus, adhesion of external matters and gas leaked out from the conductive resin paste to the crystal oscillating element can be prevented. In this way, high-frequency oscillation utilizing overtone oscillation which is likely to be influenced by external matters can be made stable and satisfactory.

In the inventive manufacturing method, a heat aging step of applying heat aging to the piezoelectric oscillating element to stabilize the frequency of the piezoelectric oscillating element is preferably performed between the piezoelectric oscillating element mounting step and the component mounting step.

In this method, no unnecessary heat is applied to the IC chip since heat aging is applied to the piezoelectric oscillating element before the IC chip and the like are mounted. Thus, the operation reliability of the oscillating circuit formed by the IC chip and the like can be improved, thereby enabling a stable oscillation output.

When the IC chip is mounted, gold bumps are formed on the respective aluminum electrodes on the non-mount surface of the IC chip, using gold wires and the like. If high heat is applied with the gold bumps formed on the aluminum electrodes, a Kirkendall's void phenomenon occurs due to a difference in diffusing speed of aluminum and gold, which causes a problem of a reduced connection strength on the interface between aluminum and gold.

Contrary to this, according to the inventive manufacturing method, the IC chip and the other components are mounted after the heat aging step. Thus, an occurrence of the Kirkendall's void phenomenon at the interface between the electrodes of the IC chip and the connecting members (bumps and wires) can be effectively suppressed, resulting in a stable bonded state. This also contributes to stable operation of the IC chip.

The above manufacturing method adopts such a wire bonding method that, when the IC chip accommodated in the IC cavity and the IC electrode pad are bonded to each other via the wire, the wire is caused to elongate in a direction substantially parallel with an ultrasonic oscillating direction of an ultrasonic bonder, thereby being bonded to the IC electrode pad, after the wire is bonded to the IC chip.

According to this method, when second bonding is applied to bond the wire to the wiring pattern after first bonding is applied to bond the wire to the electrode of the IC chip, the wire is bonded by being caused to elongate in the direction substantially parallel with the ultrasonic oscillating direction of the ultrasonic bonder and being brought into pressing contact with the wiring pattern by the capillary action as if being torn off. Accordingly, a contact area of the bonding portion is widened, thereby improving connection reliability in wire bonding.

Next, embodiments of the invention will be described with reference to the accompanying drawings in details.

FIGS. 1 to 11 show a construction of a surface mount crystal oscillator 100 as a piezoelectric oscillator according to a first embodiment of the present invention. An oscillating circuit is an overtone oscillating circuit of the third harmonic. An overtone oscillating circuit higher than the third harmonic may be used.

Figure 1:
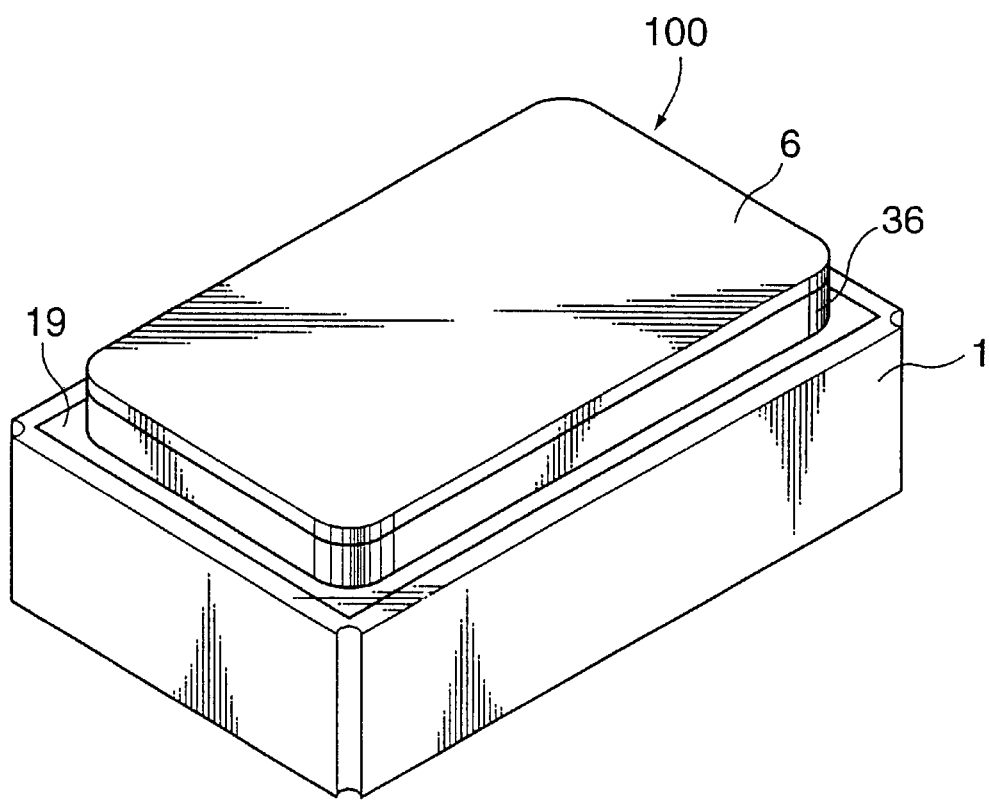
FIG. 1 is a perspective view showing an external configuration of a surface mount crystal oscillator according to an embodiment of the invention.
Figure 2:
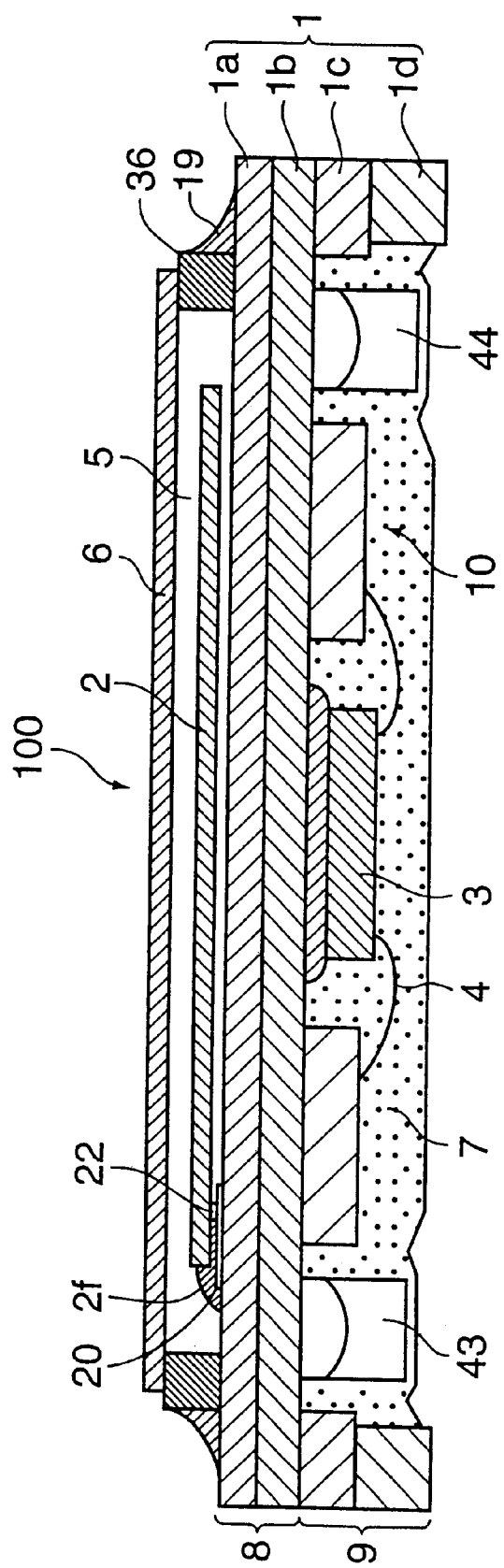
FIG. 2 is a section of the surface mount crystal oscillator.
Figure 3:
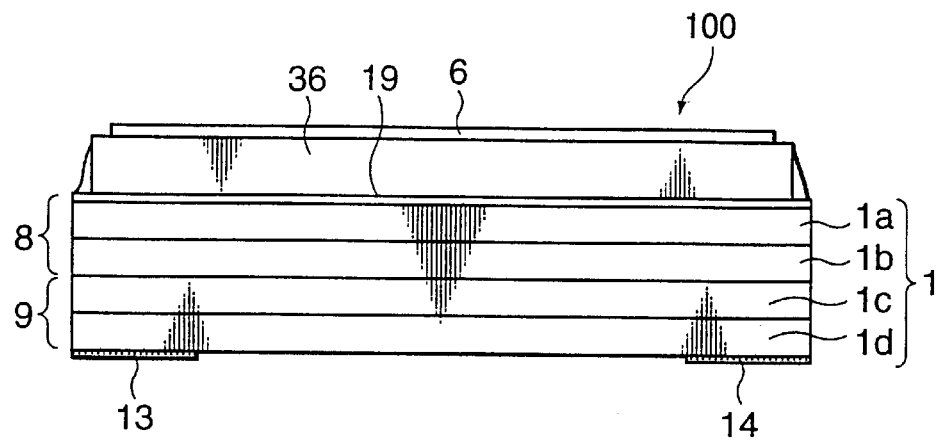
FIG. 3 is a side view of the surface mount crystal oscillator.

This crystal oscillator 100 is, as shown in FIG. 2, mainly comprised of a substantially rectangular parallelepipedic container unit 1 in which an upper cavity 5 and a lower cavity 10 are partitioned by a partition wall 8, a rectangular crystal oscillating element 2 accommodated in the upper cavity 5, an IC chip 3 and four electronic components 41 to 44 forming the oscillating circuit accommodated in the lower cavity 10, a metallic lid 6 and a filling resin 7.

The container unit 1 is formed by integrally placing a plurality of substantially rectangular ceramic insulating layers 1a, 1b, a ceramic insulating layer 1c having rectangular holes in its center and in positions at the upper, lower, left and right sides of the center, and a frame-shaped ceramic insulating layer 1d having a cross-shaped opening in its center one over another.

The ceramic insulating layers 1a, 1b form the partition wall 8 for partitioning the crystal oscillating element 2 from the IC chip 3 and the electronic components 41 to 44, and the ceramic insulating layers 1c, 1d form a frame-shaped leg portion 9. A recess surrounded by the inner wall surfaces of the frame-shaped leg portion 9 and the lower surface of the partition wall 8 serves as the lower cavity 10. External terminal electrodes 11 to 14 are formed at four corners of the bottom surface of the container unit 1.

Figure 6:
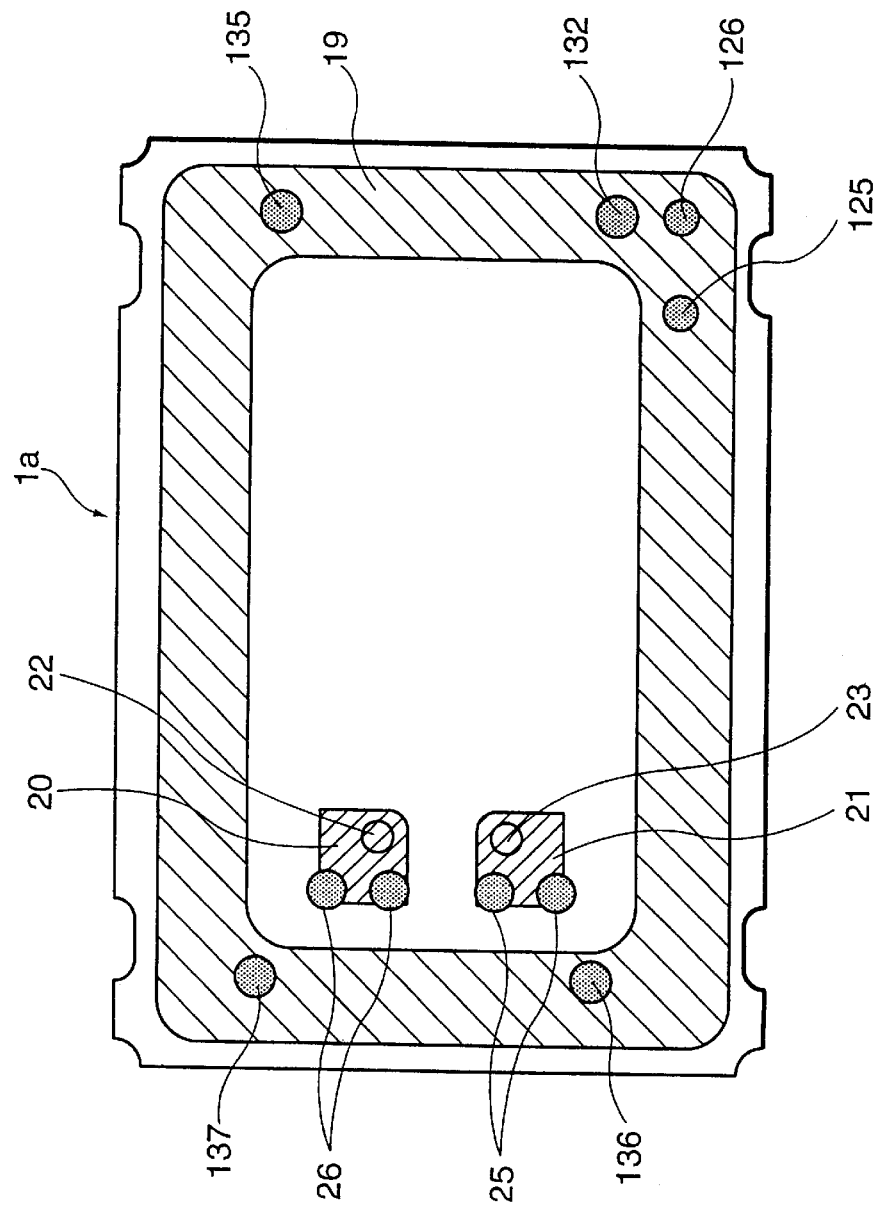
FIG. 6 is a plan view showing a ceramic insulating layer forming a container unit of the surface mount crystal oscillator.
Figure 7:
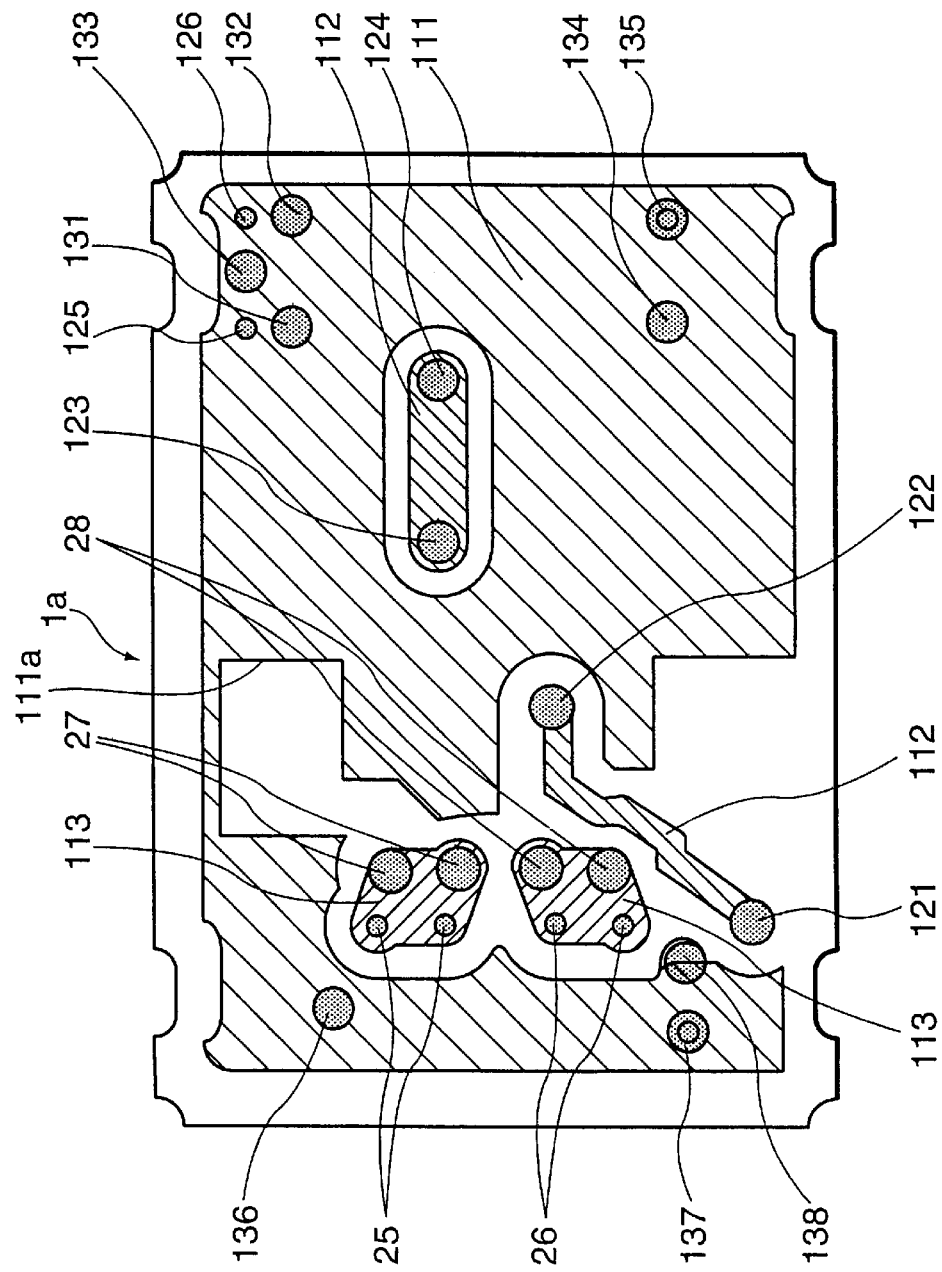
FIG. 7 is a bottom view showing the ceramic insulating layer.

More specifically, a sealing conductive film 19 is formed along the outer periphery of the upper surface of the container unit 1, i.e., the upper surface of the ceramic insulating layer la as shown in FIG. 6. Further, electrode pads 20, 21 used for the connection with the crystal oscillating element 2 are arrayed side by side at positions of the surface of the container unit 1 toward one shorter end. Connection bumps 22, 23 for defining a specified spacing on the bottom surface of the crystal oscillating element 2 are formed on the electrode pads 20, 21.

On the bottom surface of the ceramic insulating layer la are formed isolated wiring patterns 113 including via hole conductors 25, 26 for the connection with the electrode pads 20, 21, and via hole conductors 27, 28 for the connection with a wiring pattern 31 of the ceramic insulating layer 1b to be described later. On this bottom surface is further formed a Vcc pattern 112 for the power supply to the IC chip 3 and for the connection with the electronic component 44 which is a bypass capacitor Cb. A ground pattern 111 is formed substantially over the entire bottom surface in such a manner as to substantially surround the Vcc pattern 112. Via hole conductors 131 to 138 formed in this ground pattern 111 are adapted to form conductive paths for grounding the IC chip 3 and the oscillating circuit. Further, via hole conductors 125, 126 formed in the ground pattern 111 are adapted to connect the sealing conductive film 19 formed on the upper surface of the ceramic insulating layer la and the ground pattern 111. A shielding effect is given to the metallic lid 6 by joining the metallic lid 6 with the sealing conductive film 19. Via hole conductors 121 to 124 formed in the Vcc pattern 112 are for the connection with the electronic component 44 which is the bypass capacitor Cb of the oscillating circuit and form conductive paths for the power supply to the IC chip 3.

Figure 8:
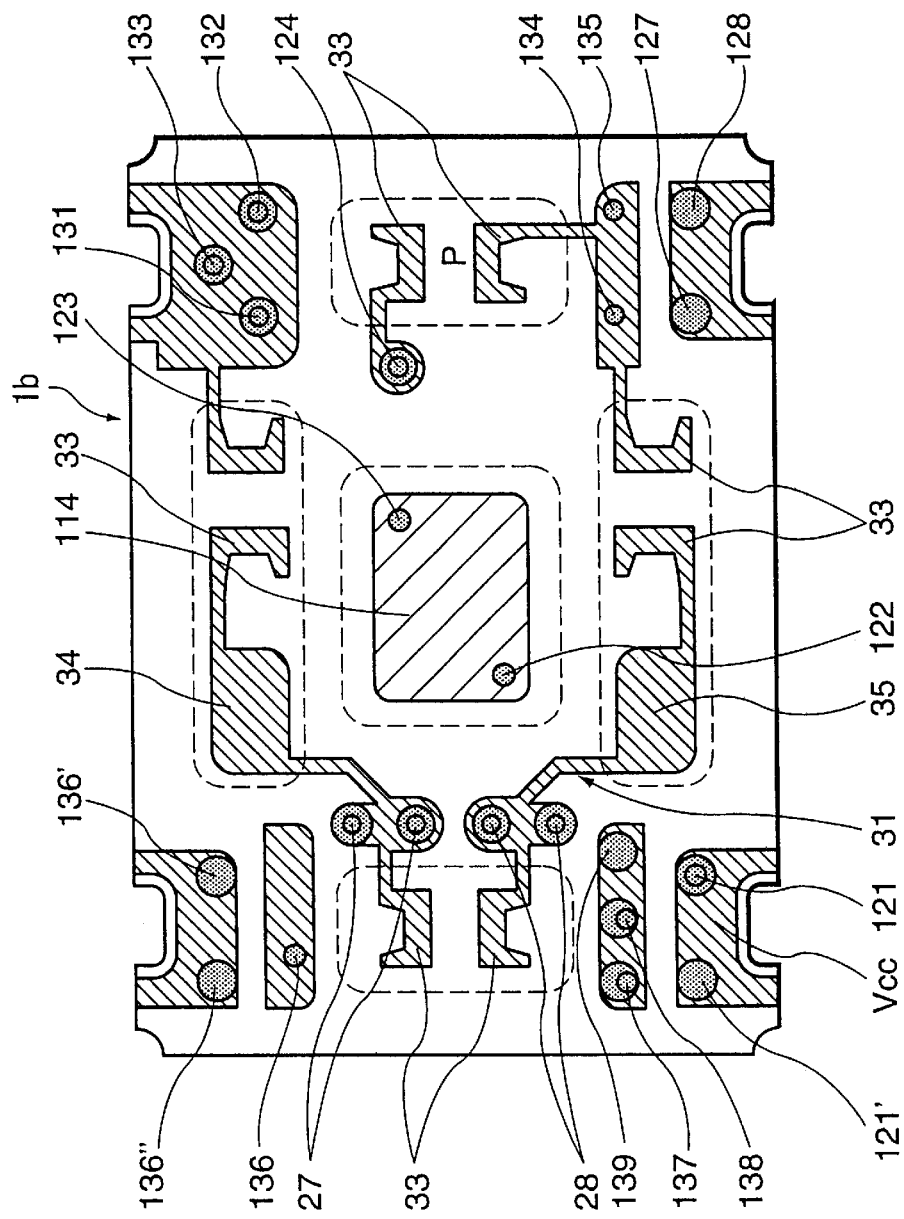
FIG. 8 is a bottom view showing another ceramic insulating layer forming the container unit of the surface mount crystal oscillator.

On the bottom surface of the ceramic insulating layer 1b, a mount 114 for the IC chip 3 is formed substantially in the center, and monitor electrode pads 34, 35 for singly measuring an oscillation characteristic of the crystal oscillating element 2 and a plurality of device electrode pads 33 are formed around the mount 114 as shown in FIG. 8. Further, the wiring pattern 31 is formed on this bottom surface to form the oscillating circuit by connecting the CI chip 3, the electronic components 41 to 44 and the external terminal electrodes 11 to 14. The via hole conductors 121 to 124, 131 to 139, 121', 136' formed in the wiring pattern 31 are connected with a wiring pattern 30 of the ceramic insulating layer 1c to be described later and form conductive paths for the connection with the IC chip 3 and the oscillating circuit. It should be noted that the mount 114 and the via hole conductors 121, 121', 122, 123, 124 form part of the conductive path for the aforementioned Vcc-potential, whereas the via hole conductors 131 to 135, 137 to 139 form a ground potential.

Figure 9:
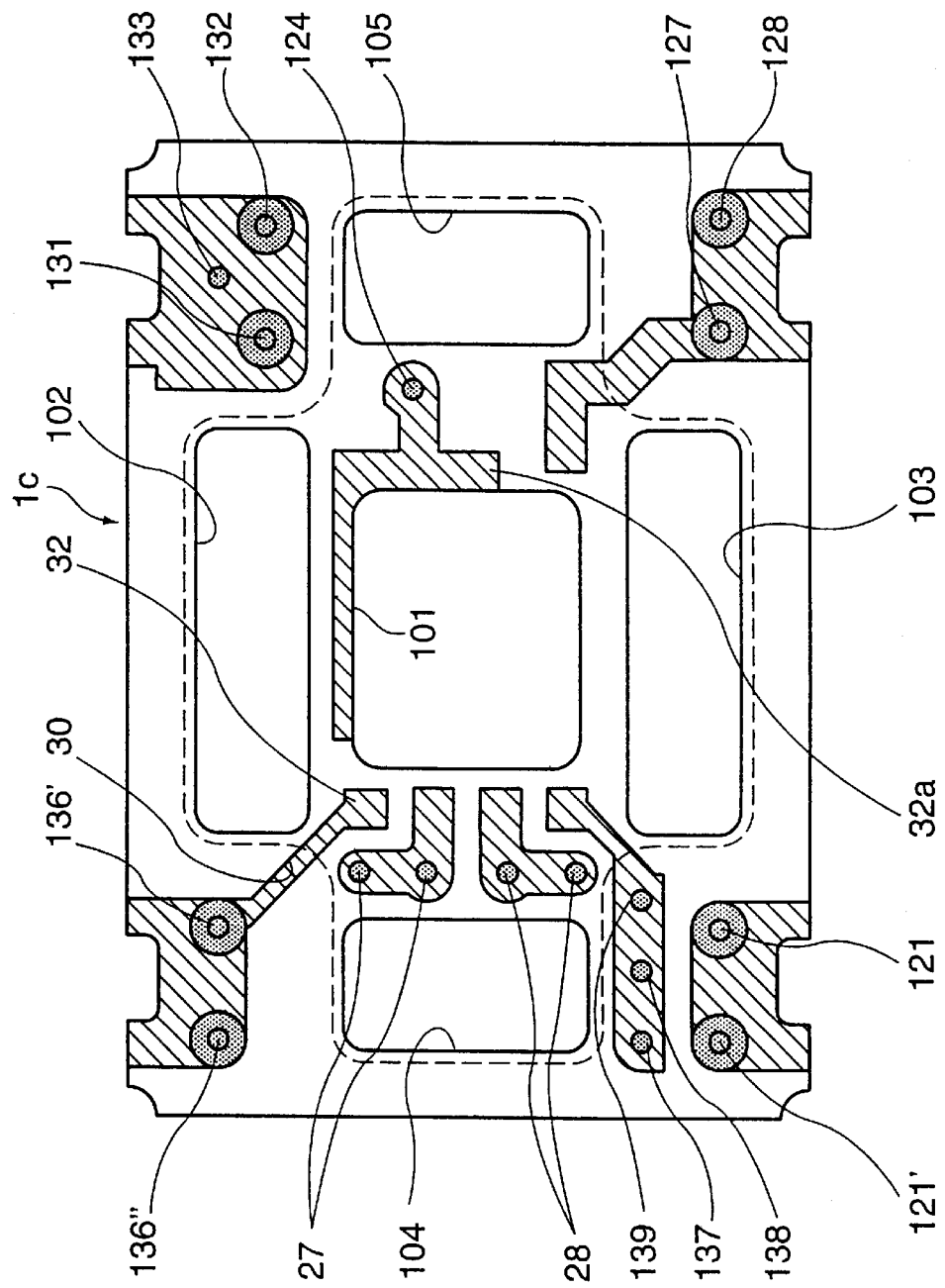
FIG. 9 is a bottom view showing still another ceramic insulating layer forming the container unit of the surface mount crystal oscillator.

As shown in FIG. 9, the ceramic insulating layer 1c is formed substantially in its center with a substantially rectangular cavity 101 for the IC chip 3 and at its upper, lower, left and right sides with substantially rectangular cavities 102 to 105 for the electronic components 41 to 44. On the bottom surface of the ceramic insulating layer 1c are formed IC electrode pads 32, 32a for the connection with the IC chip 3 and the wiring pattern 30 forming the oscillating circuit. The via hole conductors 121, 124, 131 to 139, 121', 136' are connected with the wiring pattern 30 of the ceramic insulating layer 1c and the external terminal electrodes 11 to 14 formed on the bottom surface of the ceramic insulating layer 1d to thereby form a conductive path for the connection with the IC chip 3 and the oscillating circuit. It should be noted that the via hole conductors 121, 124 and the IC electrode pad 32a form part of the conductive path for the Vcc-potential.

Figure 10:
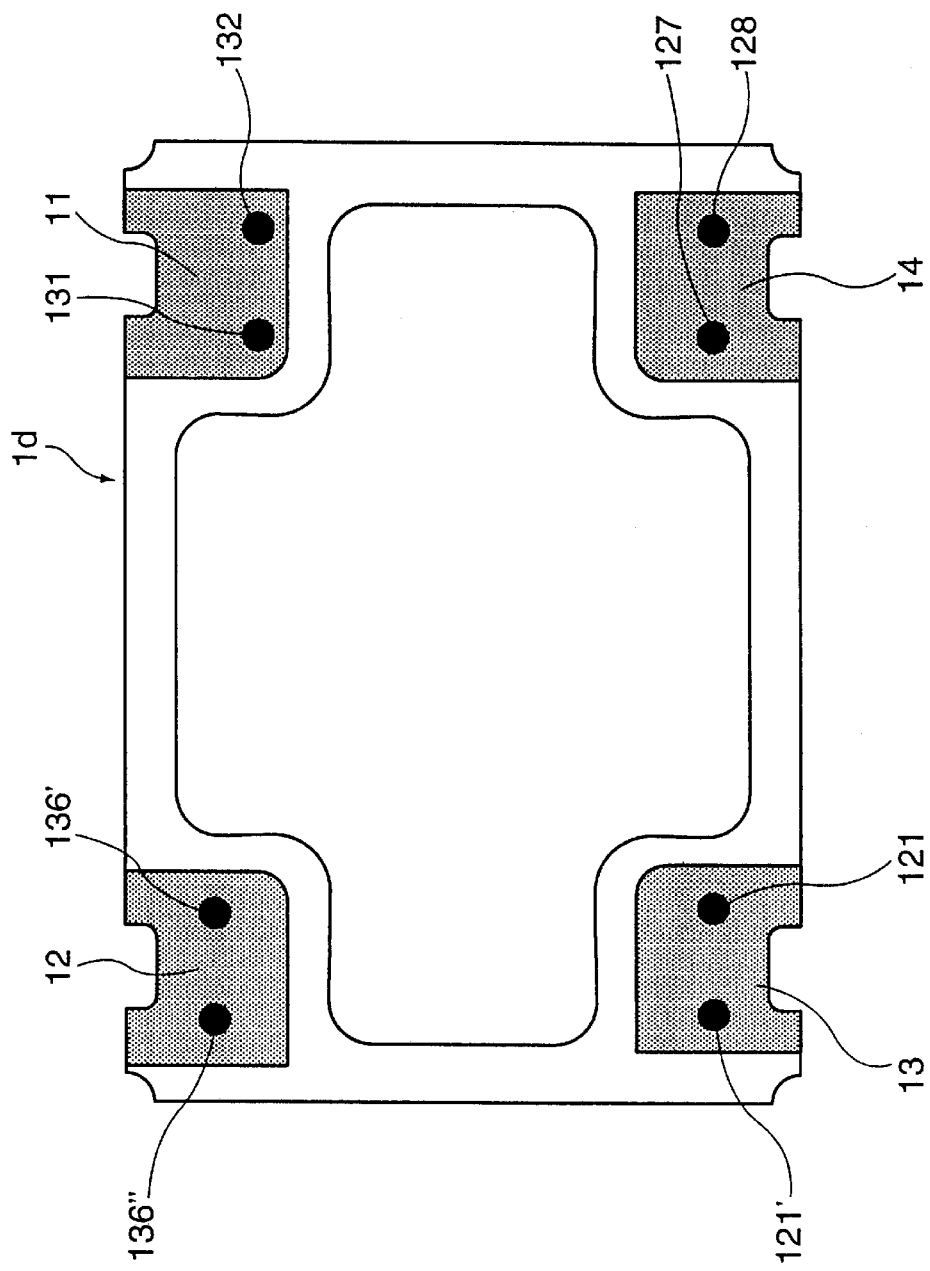
FIG. 10 is a bottom view showing the ceramic insulating layer forming the container unit of the surface mount crystal oscillator.

As shown in FIG. 10, the external terminal electrodes 11 to 14: a GND terminal 11 for grounding, a control terminal 12 for controlling the crystal oscillator 100, a Vcc-terminal 13 for the power supply, and an output terminal 14 for the oscillation output, are formed at the four corners of the bottom surface of the ceramic insulating layer 1d.

As described above, the respective conductive paths are formed by the respective electrode pads of the ceramic insulating layers 1a to 1d and the wiring patterns 30, 31 via the via hole conductors in the container unit 1 formed by placing the ceramic insulating layers 1a to 1d one over another, so that the oscillating circuit formed by the IC chip 3 and the electronic components 41 to 44 can be connected with the crystal oscillating element 2.

Between the ceramic insulating layers 1a, 1b forming the partition wall 8 of the container unit 1, the ground pattern 111 for grounding the oscillating circuit and the wiring patterns 113, 31 for connecting the crystal oscillating element 2 with the oscillating circuit are arranged in such a relationship as to suppress an occurrence of a parasitic capacity. Specifically, the ground pattern 111 is arranged between the ceramic insulating layers 1a and 1b, and the wiring patterns 113, 31 for the piezoelectric oscillating element are arranged on a principle plane at the bottom side of the insulating layer 1b. In order to minimize an overlapping portion in thickness direction via the ceramic insulating layer 1b forming the partition wall 8 of the container unit 1, a notch 111a is, for example, formed in the ground pattern 111 so as to include positions corresponding to the monitor electrode pads 34, 35 of the wiring pattern 31. Thus, the wiring patterns 113, 31 including the monitor electrode pads 34, 35 do not overlap the ground pattern 111.

The ground potential is stabilized by forming a large area of the ground pattern 111 between the insulating layers forming the partition wall 8. The wiring patterns 113, 31 are arranged with respect to this ground pattern 111 in such a relationship as to suppress an occurrence of a parasitic capacity. Since no problem resulting from a floating capacity occurs, precise and stable oscillation can be performed.

Further, the IC chip 3 is protected from noise and jitter components of an oscillation wave outputted form the output terminal 14 are reduced by a jitter reducing structure formed in the partition wall 8 of the container unit 1 partitioning the crystal oscillating element 2 and the IC chip 3. Thus, stable and satisfactory high-frequency oscillation using overtone oscillation can be performed.

As described above, the lower cavity 10 is comprised of the IC cavity 101 for accommodating the IC chip 3 and the electronic component cavities 102 to 105 for accommodating the electronic components 41 to 44, which cavities are partitioned by a partitioning portion. This partitioning portion corresponds to the ceramic insulating layer 1c, i.e., an area of the ceramic insulating layer 1c other than the openings of the cavities 101 to 105 formed in the ceramic insulating layer 1c partitions the respective cavities 101 to 105. Since the respective components 41 to 44 are accommodated in the corresponding cavities 3, 101 to 105, even if low molecular components contained in a conductive resin paste spreads on the mount surface, i.e., so-called bleedout occurs when the conductive resin paste or the like is applied to the device electrode pads 33 provided on the bottom surfaces of these cavities 102 to 105 in an operation step of mounting the electronic components 41 to 44 in the electronic component cavities 102 to 105, the influence of the bleedout can be avoided because the IC chip 3 provided on the bottom surface of the lower cavity 10 and the IC electrode pads 32 to be connected with the IC chip 3 by wire bonding are separated from each other in planar and height dimensions. Therefore, connection reliability of wire bonding can be improved.

The wiring pattern 30 is provided on the bottom surface of the lower cavity 10, and the IC electrode pad 32 of the wiring pattern 30 and electrodes 3a of the IC chip 3 accommodated in the IC cavity 101 are so set that their height positions are substantially same. Thus, the IC electrode pad 32 of the wiring pattern 30 and the electrodes 3a of the IC chip 3 are connected by short paths by wire bonding. Thus, a connecting distance by a wire 4 used in wire bonding can be shortened, and the wire 4 can be easily elongated. This enables wire bonding to be more securely performed and leads to a further improvement in connection reliability.

Further, lead wires for the wiring pattern 30 provided in the lower cavity 10 are connected via the via hole conductors. Specifically, the ceramic insulating layer 1b on which the IC chip 3 is mounted and the Vcc pattern 112 on the bottom surface of the ceramic insulating layer 1a are connected with electrodes of the IC chip 3 via the via hole conductors 121 to 124. In this way, the lead wires are internally connected with the Vcc pattern 112 via the via hole conductors 121 to 124 so that the lead wires are not exposed. In this way, connection reliability of wire bonding is improved by solving a problem of plasma cleaning that an external matter removed from the outer surface of the wiring pattern 30 is adhered to the exposed lead wire again during plasma cleaning which is a process performed before wire bonding.

By individually providing the IC chip 3 and the electronic components 41 to 44 forming the oscillating circuit instead of integrating them into one chip, a characteristic can be changed by suitably selecting the electronic components 41 to 44, thereby making it easy to set a desired characteristic of the crystal oscillator 100. In this way, versatility of the crystal oscillator 100 is improved.

Further, by accommodating the crystal oscillating element 2 in the upper cavity 5 of the container unit 1 partitioned by the partition wall 8 and accommodating the IC chip 3 and the electronic components 41 to 44 in the lower cavity 10, the respective devices can be arranged in narrow spaces, and the oscillating circuit formed by the IC chip 3 and the like is protected from noise. Therefore, the crystal oscillator 100 can be made highly reliable, smaller and have a smaller mount area.

Furthermore, the jitter reduction structure is realized by providing the ground pattern 111 for grounding the oscillating circuit between the insulating layers forming the partition wall 8. Specifically, by forming the ground pattern 111 in the partition wall 8 partitioning the crystal oscillating element 2 and the IC chip 3 and the electronic components 41 to 44 forming the oscillating circuit, the ground pattern having a large area can be formed to stabilize the ground potential, a floating capacity between the oscillating circuit and the crystal oscillating element 2 is reduced to thereby considerably reduce the jitter components of the oscillation wave outputted from the output terminal 14. Therefore, stable and satisfactory high-frequency oscillation using overtone oscillation can be more securely performed.

Further, since the Vcc pattern 112 connected with the electronic component 44 serving as the bypass capacitor Cb and adapted to supply a power to the IC chip 3 is so formed as to be substantially surrounded by the ground pattern 111, the IC chip 3 can be protected from noise given from the Vcc pattern 112 by the ground pattern 111, thereby further reducing the jitter components of the oscillation wave outputted from the output terminal 14. Accordingly, stable and satisfactory high-frequency oscillation using overtone oscillation can be even more securely performed. It should be noted that "substantially surrounded" refers to a state where it is completely surrounded and a state where it is partially exposed through an open area of the ground pattern 111.

By arranging the electronic component 44 serving as the large-capacity bypass capacitor Cb to be connected between the Vcc pattern 112 and the ground pattern 111 in the lower cavity 10, the distance of the Vcc conductive path between a connecting portion P of the electronic component 44 serving as the bypass capacitor Cb and the IC electrode pad 32a serving as a Vcc potential of the IC chip 3 can be minimized. Specifically, since the connecting portion P and the IC electrode pad 32a are connected by a short path, the influence of external noise can be reduced and high-frequency noise to be superimposed on a supply voltage to be supplied to the external terminal electrodes can be securely removed. In this way, the jitter components of the oscillation wave outputted from the output terminal 14 are further reduced. Thus, stable and satisfactory high-frequency oscillation using overtone oscillation can be more securely performed. Further, since the electronic component 44 serving as the bypass capacitor Cb is arranged in the lower cavity 10, the number of the external circuits mounted on the printed circuit board is reduced and wiring is simpler. Therefore, the crystal oscillator 100 is enabled to have a high performance and a small size.

Further, by covering the oscillating circuit accommodated in the open lower cavity 10 of the container unit 1 by resin, the oscillating circuit can be protected and have an improved humidity resistance, and the IC chip 3 can have an improved heat-radiating action.

Furthermore, if the crystal oscillator 100 can frequency-divide an oscillation output by being provided with a frequency divider, one or more outputs of a desired frequency can be obtained by frequency-dividing the oscillation output. It should be noted that the frequency divider may be formed by a flip-flop and a logic circuit and may be integrated into the IC chip 3.

Next, a method for manufacturing the aforementioned container unit 1 is described.

This container unit 1 is formed of ceramic green sheets which will become the ceramic insulating layers 1a to 1d. Specifically, through holes which will become, for example, the via hole conductors 25 to 28, 121 to 126, 131 to 138 are formed in the rectangular ceramic green sheet which will become the insulating layer 1a, and a high melting-point metallic paste of molybdenum or tungsten are filled into these through holes. Simultaneously, conductive films which will become the electrode pads 20, 21 for the crystal oscillating element, conductive films which will become connection bumps 22, 23 and a conductive film which will become the sealing conductive film 19 are formed on the upper surface of this green sheet by printing the high melting-point metallic paste.

Further, through holes which will become, for example, the via hole conductors 27, 28, 121 to 124, 127, 128, 131 to 139 are formed in a rectangular ceramic green sheet which will become the insulating layer 1b, and the high melting-point metallic paste is filled into these through holes. Simultaneously, conductive films which will become the device electrode pads 33, the monitor electrode pads 34, 35 and the wiring pattern 31 forming the oscillating circuit are formed on the lower surface of this green sheet.

Further, conductive films which will become the isolated connection pattern 113 for connecting the via hole conductors 25 to 28, the Vcc pattern 112 and the ground pattern 111 formed on the entire surface so as to substantially surround the pattern 112 are formed either one of the green sheets which will become the ceramic insulating layers 1a and 1b or their interfaces by printing the high melting-point metallic paste.

Further, through holes which will become, for example, the via hole conductors 121, 121', 124, 127, 128, 131 to 133, 136 to 139 are formed in a rectangular ceramic green sheet which will become the insulating layer 1c and is formed with the substantially rectangular openings 101 to 105 in its center, upper, lower, right and left parts, and the high melting-point metallic paste is filled into these through holes. Simultaneously, conductive films which will become the IC electrode pads 32, 32a and the wiring pattern 30 forming the oscillating circuit are formed on this green sheet.

Further, through holes which will become, for example, the via hole conductors 121, 121', 127, 128, 131, 132, 136, 136' are formed in a frame-shaped ceramic green sheet which will become the insulating layer id and is formed with the cross-shaped opening in its center, and the high melting-point metallic paste is filled into these through holes. Simultaneously, conductive films which will become the respective substantially rectangular terminals 11 to 14 are formed at the four corners around the opening of the bottom surface which is a mount surface of this green sheet.

Next, the respective green sheets are placed one over another, pressed, and then baked. Particularly in order to mount the crystal oscillating element 2 on the upper surface of the container unit 1 and the IC chip 3 in the lower cavity 10, the evenness or flatness of these two mount surfaces is essential. In a pressing step, pressing is applied with the upper surface of the container unit 1 as a reference surface. In order to press the bottom surface area of the lower cavity 10 with a uniform pressure, an auxiliary filling member may be filled into the lower cavity 10 or pressing may be applied using an upper punch having a flat pressing surface and a projecting jig. Alternatively, pressing may be separately applied to the insulating layers 1a and 1b and to the insulating layers 1c and 1d, and then the two layer assemblies are joined together by the press.

The container unit 1 is then completed by applying nickel plating, flash gold plating or the like to the terminals 11 to 14, the sealing conductive film 19, the electrode pads 20, 21, the IC electrode pads 32, 32a, the device electrode pads 33, the monitor electrode pads 34, 35, the various wiring patterns 30, 31 which are all exposed on the outer surfaces.

Accordingly, the via hole conductors and the wiring patterns 30, 31 formed inside the container unit 1 are made of high melting-point metallic conductors of, e.g., molybdenum or tungsten, and the respective terminals 11 to 14, the sealing conductive film 19, the respective electrode pads 20, 21, 32, 32a, 33, 34, 35, and the wiring patterns 30, 31 which are all exposed on the outer surfaces of the container unit 1 have a multilayer structure having the high melting-point metallic conductor as a base conductor and a nickel layer or gold layer on its outer surface.

Although the connection bumps 22, 23 on the electrode pads 20, 21 for the crystal oscillating element are so formed on the upper surface of the container unit 1 as to have a multilayer structure having the high melting-point metal as a base conductor and a nickel layer or gold layer on its outer surface, they may be formed by printing and backing a silver paste or applying and curing a resin paste containing a silver powder. In order to attain a specified height of the connection bumps 22, 23, the paste may be printed or applied a plurality of times. A dimension between the upper surface of the container unit 1 and the top of the connection bumps 22, 23 is, for example, 15 to 20 $\mu$m.

A seam ring 36 which is a substantially rectangular metallic frame is joined on the sealing conductive film 19 using a silver wax. The seam ring 36 is made of a 42 alloy which is a Fe—Ni alloy, cobal which is a Fe—Ni—Co alloy or phosphor bronze, and has a structure corresponding to the shape of the sealing conductive film 19. Thus, an area surrounded by the upper surface of the container unit 1 and the seam ring 36 serves as an accommodation area (upper cavity 5) for the crystal oscillating element 2.

Figure 4:
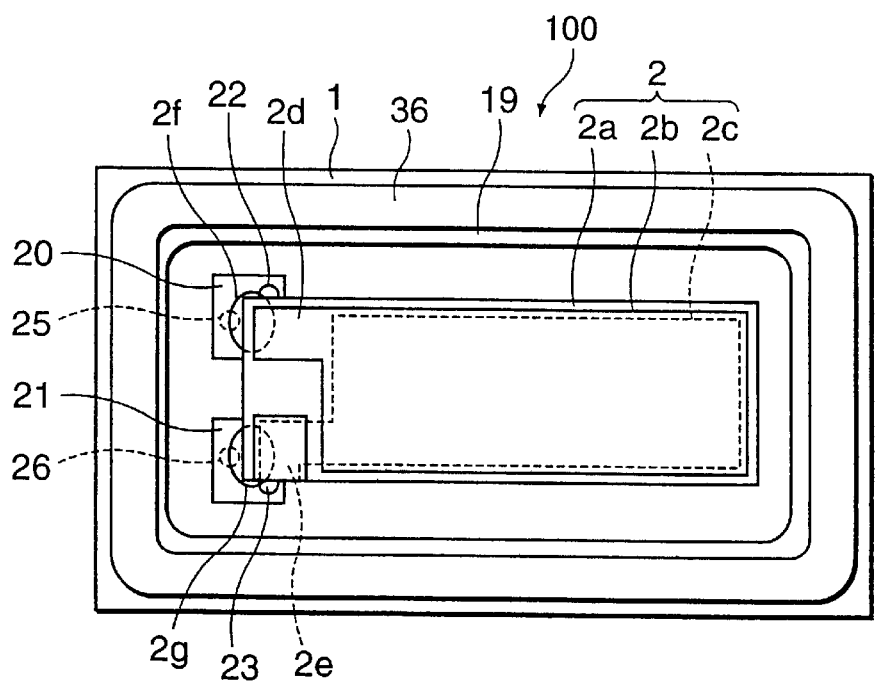
FIG. 4 is a plan view of the surface mount crystal oscillator.

The crystal oscillating element 2 is arranged on the upper surface of the container unit 1. This crystal oscillating element 2 is comprised of excitation electrodes 2b, 2c formed on both principle planes of a rectangular crystal plate 2a to which specified cutting, e.g., AT-cutting is applied, and lead electrodes 2d, 2e extended from one ends of the excitation electrodes 2b, 2c. In FIG. 4, the excitation electrode 2c and the lead electrode 2e on the lower surface are shown by dotted line. The lead electrodes 2d, 2e are connected with the electrode pads 20, 21 for the crystal oscillating element via conductive adhesive materials 2f, 2g. The excitation electrodes 2b, 2e and the lead electrodes 2d, 2e are formed by forming a base layer of chromium or nickel on each surface of the crystal plate 2a and an outer layer of silver, gold by deposition, spattering or like thin film technique.

The crystal oscillating element 2 mounted on the upper surface of the container unit 1 is hermetically sealed by the metallic lid 6. This metallic lid 6 is made of a metallic material such as cobal or 42 alloy, has a thickness of, e.g., 0.1 mm, and is welded and joined with the seam ring 36 soldered to the sealing conductive film 19 on the outer surface of the container unit 1. It is desirable to coat the outer principle surface of the metallic lid 6 by nickel or aluminum. This prevents solder from moving over to the outer principle surface of the lid 6 during welding and enables stable and strong bonding.

Figure 5:
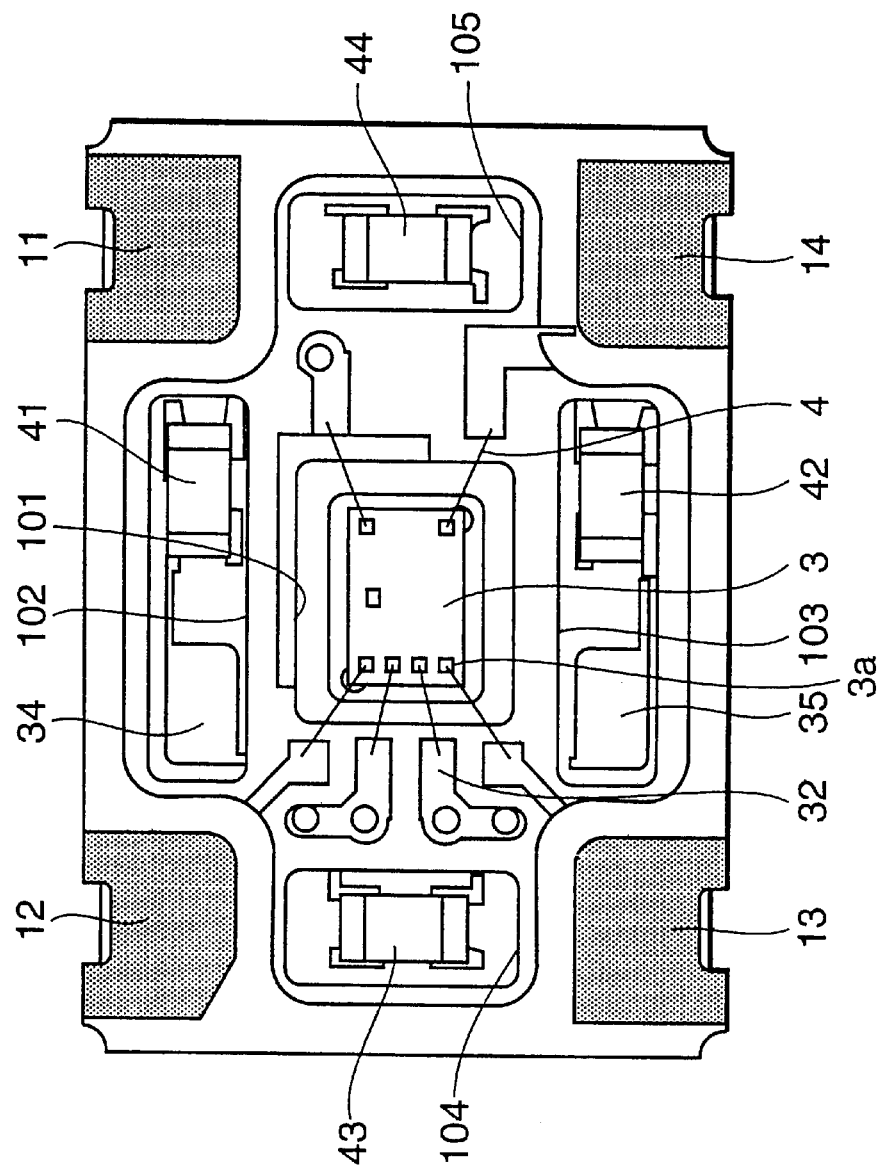
FIG. 5 is a bottom view of the surface mount crystal oscillator without a filling resin.

As shown in FIG. 5, the IC chip 3 and the electronic components 41 to 44 forming the oscillating circuit are accommodated in the lower cavity 10 of the container unit 1. This IC chip 3 is comprised of oscillating inverters 51, 52 (see FIG. 11) forming the oscillating circuit, and is provided with a Vcc electrode to which a supply voltage is supplied, a GND electrode connected with the ground potential, a crystal connection electrode connected with the crystal oscillating element 2, an output terminal for the oscillation output and a control terminal enabling an external frequency adjustment. The electronic component 41 is a drain capacity capacitor Cd; the electronic component 42 a gate capacity capacitor Cg; the electronic component 43 a return resistor Rf; and the electronic component 44 a bypass capacitor Cb having a large capacity (e.g., 103 pF).

Figure 11:
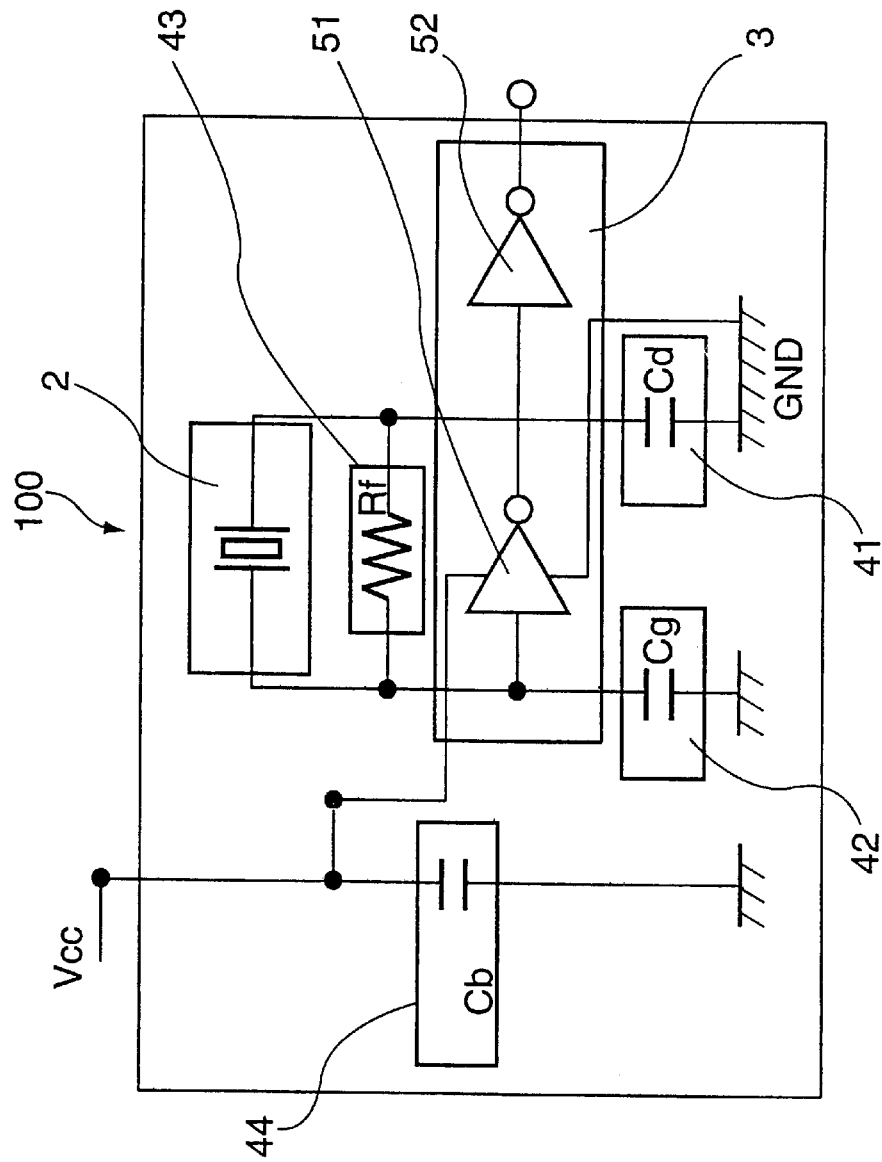
FIG. 11 is a diagram showing an oscillating circuit of the surface mount crystal oscillator.

As shown in a circuit diagram of FIG. 11, the electronic components 42, 41 which are the gate capacity capacitor Cg and the drain capacity capacitor Cd, respectively, are input/output capacities of the oscillating circuit. The electronic component 43 which is the return resistor Rf is connected between an output and an input of the oscillating inverters 51, 52 which are oscillating portions of the oscillating circuit to adjust the level of a feedback signal. The electronic component 44 which is the large-capacity bypass capacitor Cb is adapted to remove high-frequency noise superimposed onto the supply voltage to be supplied to the external terminal electrode 13, i.e., the Vcc terminal 13.

The Vcc electrode of the IC chip 3 is connected with the Vcc terminal 13 via the IC electrode pad 32a for Vcc and the wiring pattern 30 forming the oscillating circuit. The output electrode thereof is connected with the output electrode 14 via the specified IC electrode pad 32 and the wiring pattern 30 forming the oscillating circuit. The GND electrode thereof is connected with the external terminal electrode 11 via the specified IC electrode pad 32 and the wiring pattern 30 forming the oscillating circuit. The control terminal thereof is connected with the external terminal electrode 12 via the specified IC electrode pad 32 and the wiring pattern 30 forming the oscillating circuit. Further, the two crystal connection electrodes are connected with the specified IC electrode pad 32, the wiring patterns 30, 31 forming the oscillating circuit, and the monitor electrodes 34, 35, and are electrically connected with the electrode pads 20, 21 on the upper surface of the container unit 1 via the conductive paths.

These electrodes are aluminum electrodes 3a formed on a non-mount surface of the IC chip 3 and are connected with the specified IC electrode pads 32, 32a via the bonding wires 4. The mount surface of the IC chip 3 is connected with the Vcc pattern of the insulating layer 1a via the via hole conductors 122, 123 formed on the insulating layer 1b.

Each electronic component 41 (to 44) is a chip-shaped component, and is bonded between a corresponding pair of device electrode pads 33 using a conductive resin adhesive material containing silver powder.

In the lower cavity 10, the IC chip 3 and the four electronic components 41 to 44 are so arranged in conformity with the planar configuration of the lower cavity 10 as to minimize a mount space.

Further, the filling resin 7 is filled into the lower cavity 10 in order to strongly bond the IC chip 3 and the electronic components 41 to 44 and to improve a humidity resistance reliability. The filling resin 7 is filled and cured to such a degree as to completely cover at least the upper surfaces of the IC chip 3 and the electronic components 41 to 44. It should be noted that the filling resin 7 is so filled as not to project from an opening plane of the lower cavity 10. This is to stably arrange the surface mount crystal oscillator 100 on the printed circuit board.

In the aforementioned crystal oscillator 100, the IC chip 3 and the four electronic components 41 to 44 are, as shown in FIG. 5, mounted in the lower cavity 10 such that a component having a large planar shape such as the IC chip 3 is provided in the center and the electronic components 41 to 44 having smaller outer shapes are arranged around the IC chip 3. In this way, an arrangement taking account of space minimization and a bottom surface structure of the container unit 1 are specified. Specifically, the IC chip 3 is arranged in the IC cavity 101 formed substantially in the center of the bottom surface of the container unit 1, and the electronic components 41 to 44 are arranged in the electronic component cavities 102 to 105 formed at the upper, lower, left and right sides of the IC cavity 101. Further, the external terminal electrodes 11 to 14 are arranged in the four corner areas of the bottom surface of the container unit 1. By adopting such an arrangement, no dead space exists on the entire bottom surface of the container unit 1, thereby making the mount surface of the container unit 1 of the crystal oscillator 100 considerably small.

Further, as shown in the circuit diagram of the crystal oscillator 100 of FIG. 11, the IC chip 3 is comprised only of the oscillating inverters 51, 52 forming the oscillating circuit. The electronic components 41, 42 which are the drain capacity capacitor Cd and the gate capacity capacitor Cg as input/output capacities of the oscillating circuit are arranged at the upper and lower sides of the IC chip 3, and the electronic components 43, 44 which are the return resistor Rf and the large-capacity bypass capacitor Cb are arranged at the left and right sides of the IC chip 3.

By adopting such a construction in which the electronic components 41 to 43 are not integrated into the IC chip 3, these electronic components 41 to 43 can be suitably selected and the crystal oscillator can be easily set to have a desired characteristic.

The electronic component 44 which is the large-capacity bypass capacitor Cb is adapted to remove high-frequency noise superimposed on the supply voltage supplied to the Vcc external terminal electrode 13. In the prior art, the electronic component 44 has been arranged on a printed circuit board on which the crystal oscillator is mounted because it is difficult to integrate it into the IC chip 3. Contrary to this, the electronic component 44 is also mounted as a chip-shaped component in the lower cavity 10 of the container unit 1 according to the present invention. Thus, the number of the electronic components mounted on the printed circuit board is reduced, and wiring is simpler. As a result, the surface mount crystal oscillator 100 can largely contribute to a miniaturization required for a mobile communication equipment and the like and can be very easily handled.

Figure 12:
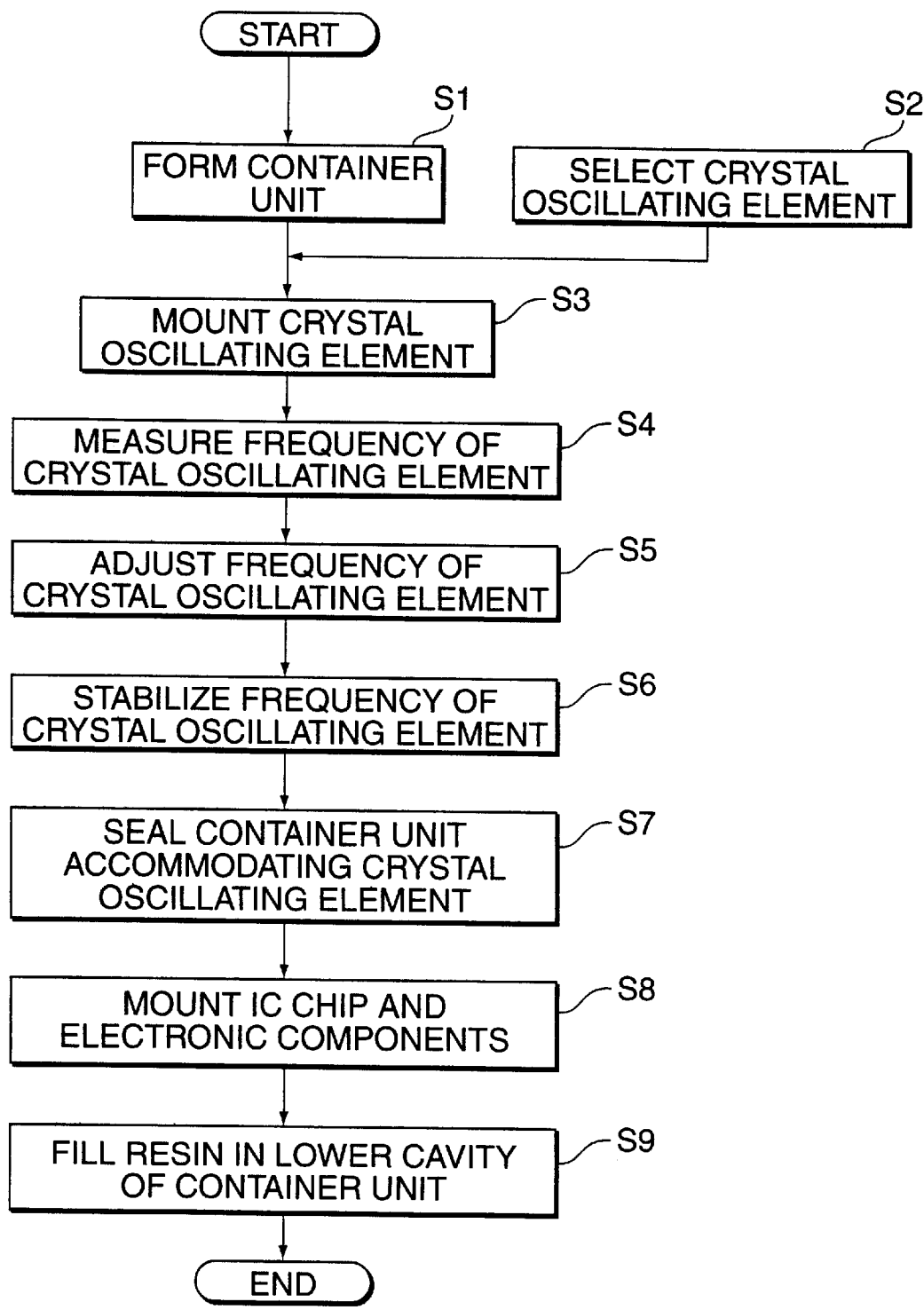
FIG. 12 is a flowchart showing a manufacturing process of the surface mount crystal oscillator.

Next, a method for assembling the crystal oscillator 100 described above is described with reference to a flowchart shown in FIG. 12.

First, the container unit 1 is formed (Step S1). The detailed structure and the method for forming it are as described above.

Simultaneously, the crystal oscillating elements 2 are selected (Step S2). In other words, the crystal oscillating elements 2 are ranked based on their frequency variation since their frequency characteristics are largely variable due to a very small fluctuation of a cutting angle.

Then, the container unit 1, the crystal oscillating element 2, the IC chip 3, the electronic components 41 to 44 such as capacitors and resistors and the metallic lid 6 are prepared. On the outer surface of the container unit 1, the seal ring 36 is bonded by soldering or the like and a bump 24 is formed, and the bumps 22, 23 are formed on the electrode pads 20, 21. Further, gold bumps are formed on the respective aluminum electrodes on the outer surface of the IC chip 3.

Subsequently, the crystal oscillating element 2 having specified characteristics is mounted (Step S3). Specifically, the crystal oscillating element 2 is placed while being positioned such that the connection bumps 22, 23 formed on the electrode pads 20, 21 on the outer surface of the container unit 1 are in agreement with the lead electrodes 2d, 2e of the crystal oscillating element 2, and the lead electrodes 2d, 2e and the electrode pads 20, 21 are bonded to each other using the conductive adhesive materials 2f, 2g containing silver or the like.

In this way, the excitation electrodes 2b, 2c of the crystal oscillating element 2 are connected with the specified electrode pad 32 and the monitor electrode pads 34, 35 formed on the bottom surface of the lower cavity 10 via the electrode pads 20, 21, the via hole conductors 25 to 28, and the wiring patterns 30, 31.

Subsequently, the frequency of the crystal oscillating element 2 is measured (Step S4). Specifically, a measurement terminal (probe) of a frequency measuring apparatus is brought into contact with the monitor electrodes 34, 35 to measure the frequency of the crystal oscillating element 2 caused to oscillate in a specific manner.

Subsequently, the frequency of the crystal oscillating element 2 is adjusted (Step S5). Specifically, the oscillation frequency is adjusted by blowing an inactive gas such as argon gas against the excitation electrode 2*b* on the upper surface of the crystal oscillating element 2 bonded to the container unit 1 based on the above measurement result, using an ion gun or the like, to thereby carve the excitation electrode 2*b* or by depositing a metal such as silver to change the mass of the excitation electrode 2*b*.

Subsequently, the adjusted frequency of the crystal oscillating element 2 is stabilized (Step S6). Specifically, the entire container unit 1 to which the crystal oscillating element 2 is bonded is heated at 150° C. to 250° C. This heating treatment is generally called heat aging. By this heat aging, the matter deposited on the excitation electrode 2*b* for the frequency adjustment is stabilized, and impurities such as a solvent contained in the conductive paste are volatilized.

Subsequently, the container unit 1 accommodating the crystal oscillating element 2 is sealed by the metallic led 6 (Step S7). Specifically, the metallic lid 6 is placed on the seam ring 36, and welded thereto by moving a roller electrode (not shown) for seam welding in contact along the periphery of the metallic lid 6 while applying a welding current.

Subsequently, the IC chip 3 and the electronic components 41 to 44 are mounted in the lower cavity 10 (Step S8).

Specifically, the respective electronic components 41 to 44 are bonded by being placed on the conductive resin paste containing silver powder or the like applied between the pairs of device electrode pads 33 and curing the conductive resin paste.

The IC chip 3 is mounted as follows. After the IC chip 3 is placed and positioned and has die-bonding applied thereto, plasma cleaning is applied. Then, the respective aluminum electrodes formed on the non-mount surface of the IC chip 3 are connected with the specified IC electrode pads 32 via the bonding wires 4 (hereinafter, merely "wires").

Specifically, after first bonding is applied to bond the wires 4 to the electrodes 3*a* of the IC chip 3, second bonding is applied to bond these wires 4 to the IC electrode pads 32 of the wiring pattern. At this stage, the wires 4 are bonded by being caused to elongate in a direction substantially parallel with an ultrasonic oscillating direction of an ultrasonic bonder and being brought into pressing contact with the IC electrode pads 32 of the wiring pattern 30 by the capillary action as if being torn off.

In order to prevent the transfer of heat caused by curing of the conductive paste to the IC chip 3, the IC chip 3 may be mounted after the electronic components 41 to 44 are mounted.

When the IC chip 3 is mounted, gold bumps are formed on the respective aluminum electrodes on the non-mount surface of the IC chip 3, using gold wires. If high heat is applied with the gold bumps formed on the aluminum electrodes, a Kirkendall's void phenomenon occurs due to a difference in diffusing speed of aluminum and gold, which causes a problem of a reduced connection strength on the interface between aluminum and gold.

Contrary to this, according to the inventive manufacturing method, the IC chip 3 is mounted after the heat aging step (Step S6). Thus, an occurrence of the Kirkendall's void phenomenon at the interface between the electrodes of the IC chip 3 and the connecting members (bumps and wires) can be effectively suppressed, resulting in a stable bonded state. Therefore, the IC chip 3 can stably operate.

Subsequently, the filling resin 7 is filled into the lower cavity 10 so as to cover the IC chip 3 and the electronic components 41 to 44 (Step S9). Specifically, an epoxy resin having an excellent humidity resistance is fitted into the lower cavity 10 in which the IC chip 3 and the electronic components 41 to 44 are arranged, and is cured.

In the above way, assembling of the crystal oscillator 100 is completed and a specific electric test is conducted thereafter.

According to the aforementioned manufacturing method, when second bonding is applied to bond the wires 4 to the IC electrode pads 32 of the wiring pattern after first bonding is applied to bond the wires 4 to the electrodes 3*a* of the IC chip 3, the wires 4 are bonded by being caused to elongate in the direction substantially parallel with the ultrasonic oscillating direction of the ultrasonic bonder and being brought into pressing contact with the IC electrode pads 32 of the wiring pattern 30 by the capillary action as if being torn off. Accordingly, contact areas of the bonding portions are widened, thereby improving connection reliability in wire bonding.

Figure 17:
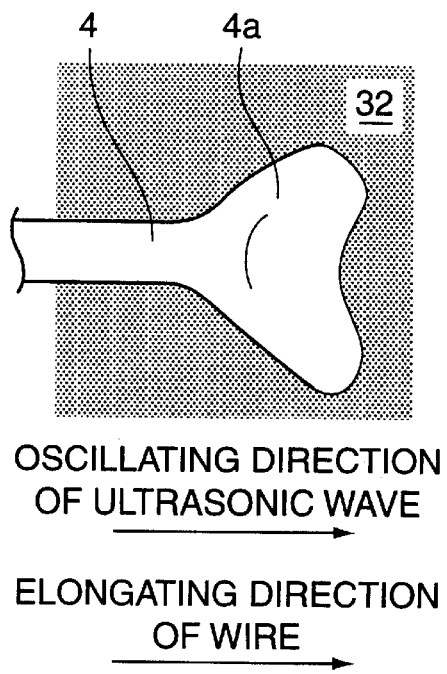
FIG. 17 is a diagram showing a state of a bonding portion when wire bonding is applied with a wire extended in a direction substantially parallel with an ultrasonic wave oscillating direction of an ultrasonic bonder according to a wire bonding method adopted in a method for manufacturing an inventive piezoelectric oscillator.
Figure 18:
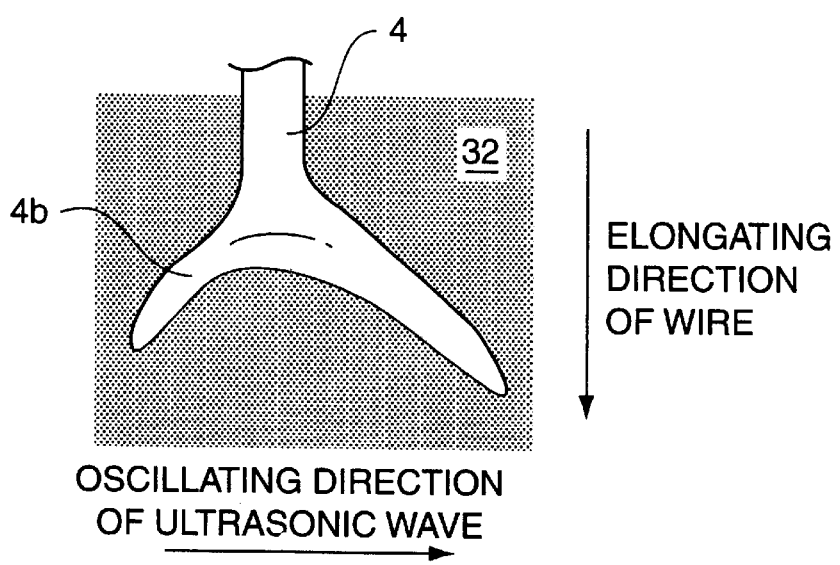
FIG. 18 is a diagram showing a state of a bonding portion when wire bonding is applied with a wire extended in a direction normal to the ultrasonic wave oscillating direction of the ultrasonic bonder as a comparison test.

FIG. 17 shows a state of a bonding portion 4*a* when wire bonding is applied according to the above method, and FIG. 18 shows a state of a bonding portion 4*b* when wire bonding is applied by causing the wire 4 to elongate in a direction normal to the ultrasonic oscillating direction of the ultrasonic bonder. A comparison of these two states shows that the bonding portion 4*a* shown in FIG. 17 is in a satisfactory bonding state while having a wide contact area, whereas the bonding portion 4*b* shown in FIG. 18 is in a poor bonding state while having a narrow contact area. This result confirmed that the above wire bonding method is effective in satisfactorily applying wire bonding.

Since the crystal oscillating element 2 is mounted before the IC chip 3 and the electronic components 41 to 44 are mounted according to the above manufacturing method, adhesion of external matters and gas leaked out from the conductive resin paste to the crystal oscillating element 2 is prevented by mounting the IC chip 3 and the electronic components 41 to 44 in the lower cavity 10 of the container unit 1 using the conductive resin paste after the crystal oscillating element 2 is mounted in the upper cavity 5 of the container unit 1 and the container unit 1 is sealed.

Specifically, high-frequency oscillation utilizing overtone oscillation which is likely to be influenced by external matters due to an increase in a crystal impedance value which is a resonant resistance value of the crystal oscillating element 2 is made stable and satisfactory by eliminating the influence of the external matters.

Further, according to the above manufacturing method, the heat aging step for stabilizing the frequency of the crystal oscillating element 2 is provided between the step of mounting the crystal oscillating element 2 and the step of mounting the IC chip 3 and the electronic components 41 to 44. In other words, no unnecessary heat is applied to the IC chip 3 by enabling the heat aging step for the crystal oscillating element 2 to be performed before the IC chip 3 and the like are mounted. In this way, the operation reliability of the oscillating circuit formed by the IC chip 3 and the like is improved, thereby making high-frequency oscillation utilizing overtone oscillation stable and satisfactory.

Figure 19A:
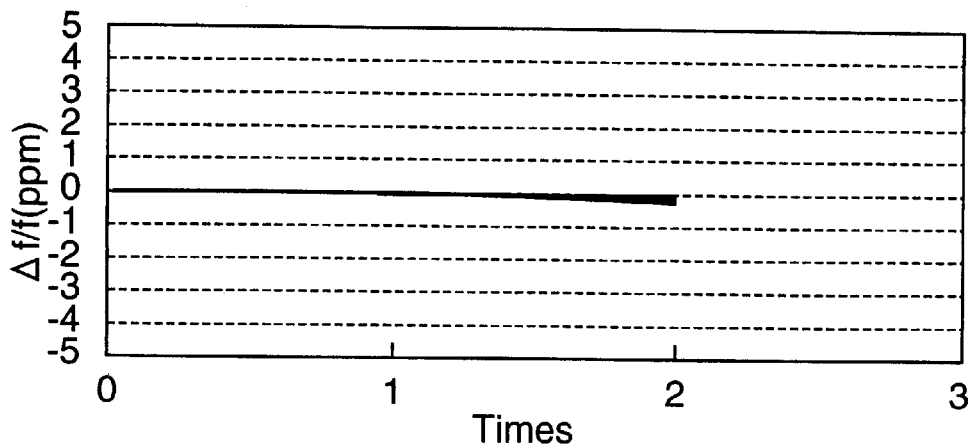
FIGS. 19A and 19B are graphs showing heat-caused variations of a frequency characteristic of the surface mount crystal oscillator as an inventive piezoelectric oscillator at the time of reflowing at 250° C. and at the time of heat aging at 125° C., respectively.
Figure 19B:
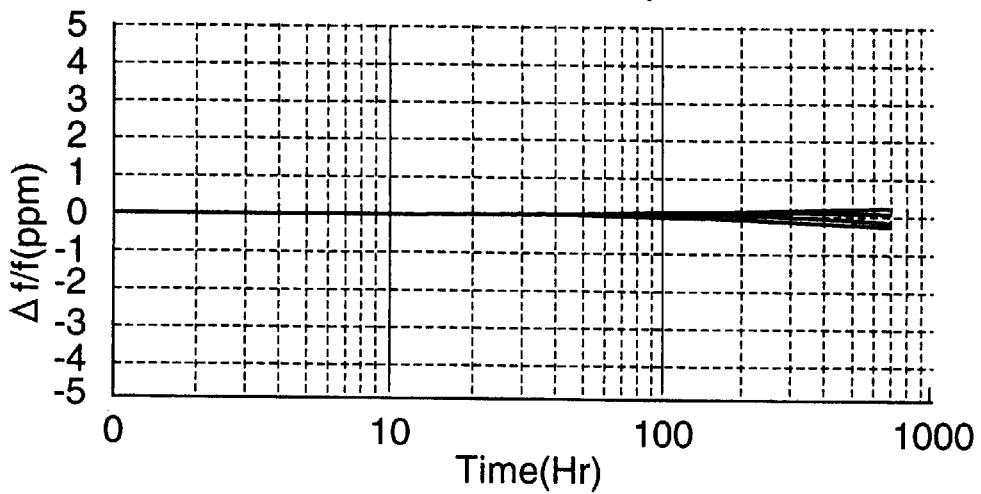
Figure 20A:
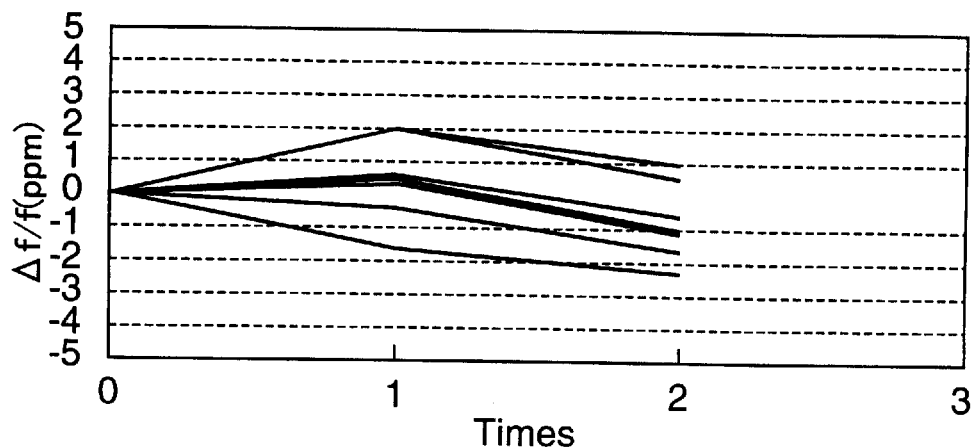
FIGS. 20A and 20B are graphs showing heat-caused variations of a frequency characteristic of a conventional surface mount crystal oscillator at the time of reflowing at 250° C. and at the time of heat aging at 125° C., respectively.
Figure 20B:
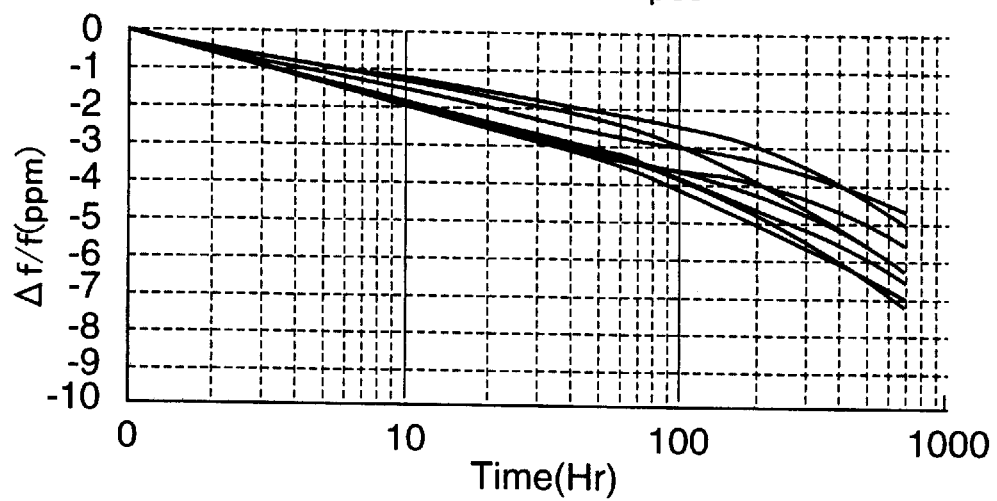

FIGS. 19A and 19B show characteristic variations when the crystal oscillator 100 is caused to oscillate at 106.250 MHz with time and frequency change rate taken along horizontal axis and vertical axis, when the crystal oscillator 100 was subjected to reflowing at 250° C. and when it was subjected to heat aging at 125° C. FIGS. 20A and 20B show a result of a similar test conducted on a conventional oscillator having such a construction that a crystal oscillating element and an IC for oscillating circuit are arranged in one cavity.

As is clear from the comparison of the two results, the frequency characteristic of the crystal oscillator 100 is hardly changed by heat, whereas that of the conventional oscillator is largely changed by heat.

FIGS. 13 to 16 show a construction of a surface mount crystal oscillator 300 as a piezoelectric oscillator according to a second embodiment of the present invention.

Figure 13:
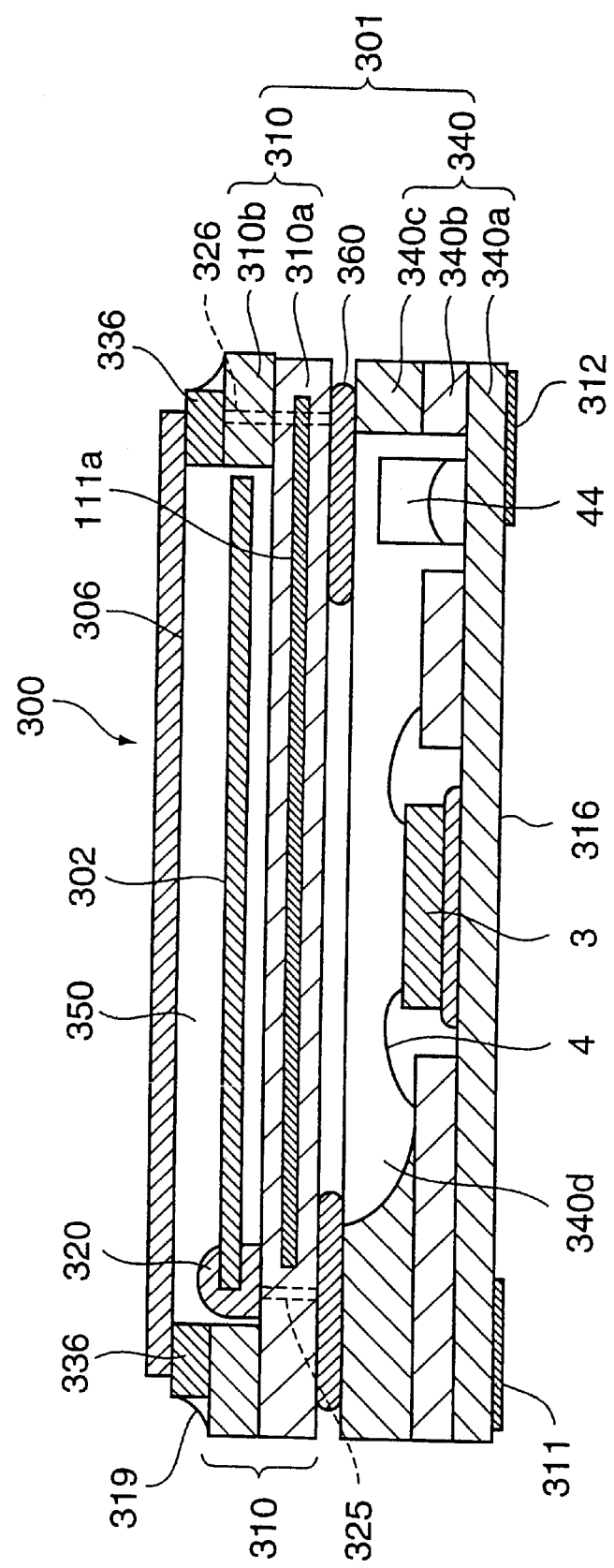
FIG. 13 is a section showing a construction of a surface mount crystal oscillator according to a second embodiment of the invention.

This crystal oscillator 300 is, as shown in FIG. 13, provided at a lower part of a container unit 301 with a lower cavity 340d in which an IC chip 303 is accommodated and at an upper part thereof with an upper cavity 350 in which a crystal oscillating element 302 is arranged. The lower cavity 340d accommodating the IC chip 303 is open upward.

Specifically, the container unit 301 is comprised of a first container 310 and a second container 340. The first container 310 is comprised of a ceramic layer 310a in the form of a flat plate which serves as a partition wall and a ring-shaped ceramic layer 310b, and a seam ring 336 is provided on the outer surface of the ring-shaped ceramic layer 310b. The crystal oscillating element 302 is arranged in the upper cavity 350 defined by the ceramic layers 310a, 310b and the seam ring 336, and the crystal oscillating element 302 is hermetically sealed by a metallic lid 306. It should be noted that the ceramic layer 310a has a multilayer structure as in the aforementioned first embodiment (not shown), and a ground pattern 111a is arranged between the layers of the ceramic layer 310a and connected with a via hole conductor 326 which serves as a ground potential.

Figure 15:
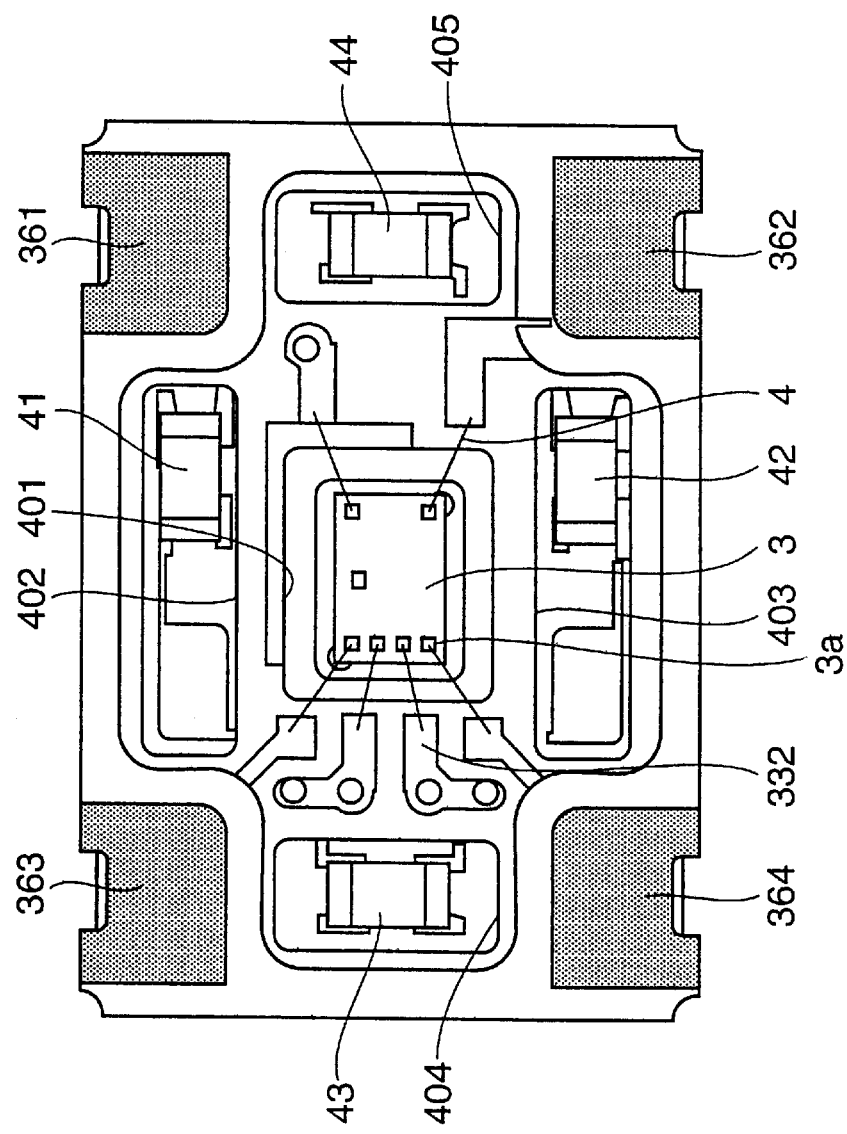
FIG. 15 is a plan view showing a construction of a second container forming the container unit of the second surface mount crystal oscillator.

The second container 340 is comprised of a ceramic layer 340a in the form of a flat plate, a ceramic insulating layer 340b having a substantially rectangular IC cavity 401 formed substantially in its center and substantially rectangular electronic component cavities 402 to 405 formed at the upper, lower, left and right sides of the IC cavity 401, and a ring-shaped ceramic layer 340c. As shown in FIG. 15, the IC chip 303 and electronic components 341 to 344 are arranged in the lower cavity 340d defined by the ceramic layer 340a and the ceramic layers 340b, 340c. It should be noted that electrode pads and specified wiring patterns on which the IC chip 303 and the electronic components 341 to 344 are arranged are formed on the bottom surface of the cavity 340d.

Figure 14:
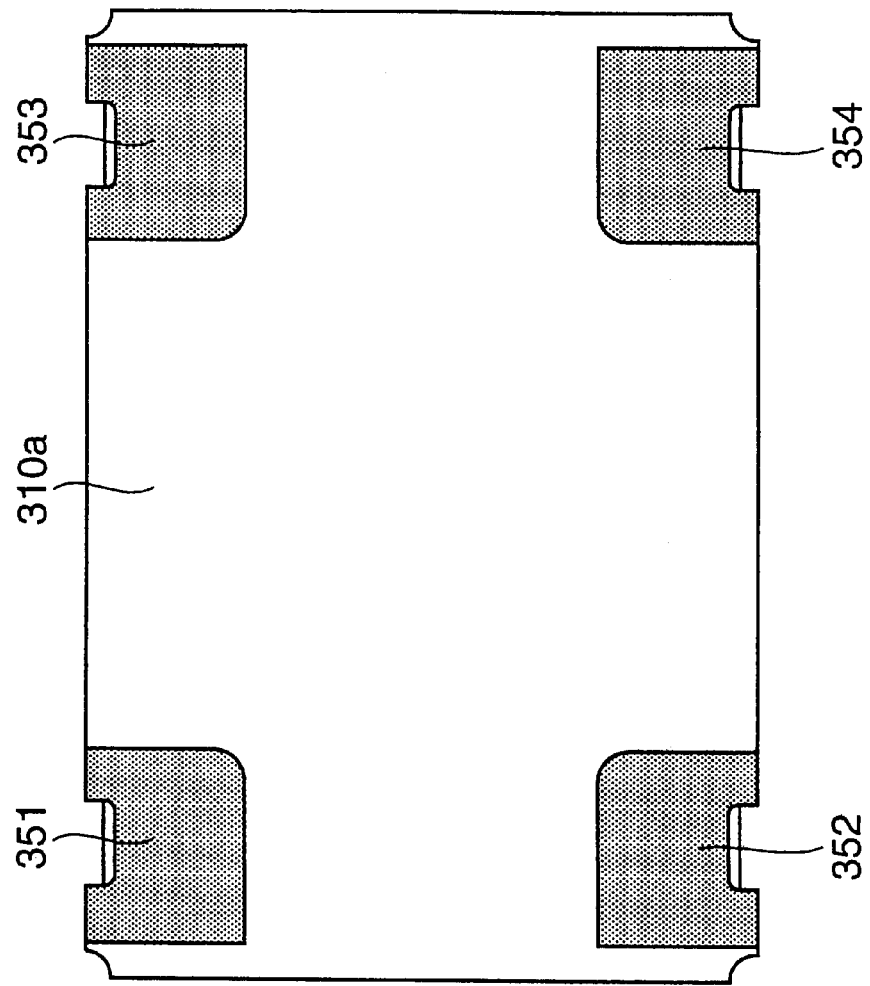
FIG. 14 is a bottom view showing a construction of a first container forming a container unit of the second surface mount crystal oscillator.

As shown in FIG. 14, bonding terminal electrodes 351 to 354 are formed at four corners of the bottom surface of the first container 310. The bonding terminal electrodes 351, 352 are electrically connected with an electrode pad 320 for the crystal oscillating element by way of a via hole conductor 325. The bonding terminal electrodes 353, 354 serve as a ground potential and are electrically connected with the seam ring 336 by the way of the via hole conductor 326.

The second container 340 has, as shown in FIG. 15, the cavity 340d open in its upper surface. Bonding terminal electrodes 361 to 364 are formed around an opening of the cavity 340d. The bonding terminal electrodes 361, 362 are connected with the bonding terminal electrodes 353, 354 on the bottom surface of the first container 310, and the bonding terminal electrodes 363, 364 are connected with the bonding terminal electrodes 351, 352 on the bottom surface of the first container 310. The bonding terminal electrodes 361 to 364 are electrically connected with specified wiring patterns by way of via hole conductors (not shown) penetrating through the ceramic layers 340c, 340b.

Figure 16:
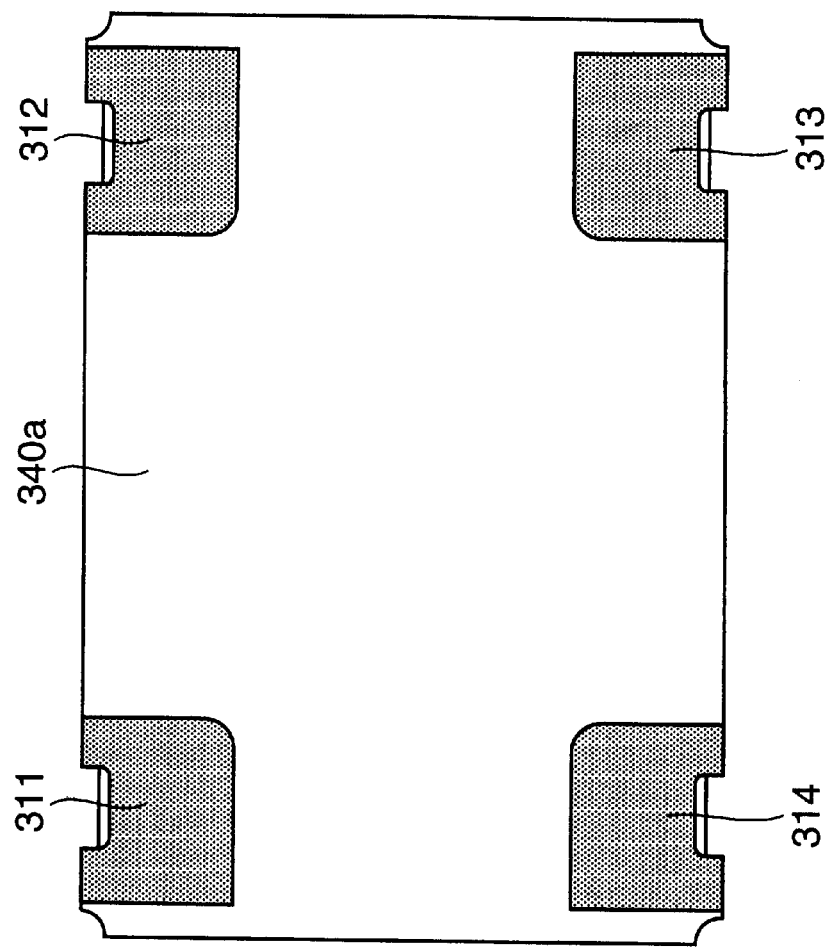
FIG. 16 is a bottom view showing a construction of the second container forming the container unit of the second surface mount crystal oscillator.

Further, as shown in FIG. 16, external terminals 311 to 314 are formed at four corners of the bottom surface of the second container 340. The external terminals 311 to 314 are electrically connected with specified wiring patterns by way of via hole conductors (not shown) formed in the ceramic layer 340a.

For example, the external terminal 311 is a Vcc terminal electrode; the external terminal 312 an output terminal for the oscillation output; the external terminal 313 a GND terminal; and the external terminal 314 a control terminal used, e.g., for the frequency adjustment.

The first and second containers 310 and 340 are made integral to each other by bonding the bonding terminal electrodes 351 to 354 of the first container 310 to the bonding terminal electrodes 361 to 364 of the second container 340 via conductive adhesive materials 360 made of solder or conductive resin paste containing a metallic powder such as silver. In other words, the lower cavity 340d open in the upper surface of the second container 340 is covered by the first container 310 placed on the second container 340.

The aforementioned oscillating circuit shown in FIG. 11 is formed by mounting the IC chip 303 and the electronic components 341 to 344 such that the IC chip 303 having a large planar shape is provided in the center and the electronic components 341 to 344 having smaller outer shapes are arranged around the IC chip 303. Specifically, the IC chip 303 is arranged in the IC cavity 401 formed substantially in the center of the upper surface of the second container 304, and the electronic components 341 to 344 are arranged in the electronic component cavities 402 to 405 formed at the upper, lower, left and right sides of the IC cavity 401. The external terminals 311 to 314 are arranged at the four corners of the bottom surface of the second container 340.

The piezoelectric oscillator and its manufacturing method according to the present invention are not limited to the specific constructions and processes of the respective embodiments described above. The construction or process may be suitably modified and addition, replacement or deletion may be suitably made therein if necessary.

For example, four electronic components are mounted in the electronic component cavities formed in the lower cavity in the foregoing embodiments. The present invention is not limited thereto. The number of the cavities and that of the electronic components may be suitably changed if necessary.

The piezoelectric oscillator and its manufacturing method are not limitedly applied to the aforementioned high-frequency oscillators utilizing overtone oscillation, and they may be applied to oscillators utilizing a fundamental wave.

As described above, the IC chip can be protected from noise and the jitter components of the oscillation wave outputted from the output terminal can be reduced by the jitter reducing structure formed in the partition wall of the container unit partitioning the piezoelectric oscillating element and the IC chip. Therefore, stable and satisfactory high-frequency oscillation utilizing overtone oscillation can be performed.

Further, the IC chip and the electronic components are made independent of each other without integrating the electronic components forming the oscillating circuit into the IC chip. Thus, it becomes easy to change a characteristic by suitably selecting the electronic components to set the piezoelectric oscillator at a desired characteristic, thereby improving the versatility of the piezoelectric oscillator.

Further, the crystal oscillating element is accommodated in the upper cavity of the container unit partitioned by the partition wall, and the IC chip and the electronic components forming the oscillating circuit are accommodated in the lower cavity. Thus, the respective devices can be compactly arranged in a narrow space and the oscillating circuit formed by the IC chip and the like can be protected from noise. Therefore, the piezoelectric oscillator can be made highly reliable and smaller and have a smaller mount surface.

Further, the partition wall is formed by placing a plurality of insulating layers one over another, and the ground pattern for grounding the oscillating circuit is arranged between the plurality of insulating layers as the jitter reducing structure. Specifically, the ground pattern having a large area can be formed by forming it in the partition wall partitioning the crystal oscillating element and the IC chip and the electronic components forming the oscillating circuit. Thus, the ground potential can be stabilized, the floating capacity between the oscillating circuit and crystal oscillating element can be reduced, thereby considerably reducing the jitter components of the oscillation wave outputted from the output terminal. Therefore, stable and satisfactory high-frequency oscillation utilizing overtone oscillation can be more securely performed.

Further, if the power supply pattern for supplying a supply voltage to the oscillating circuit is formed between the insulating layers forming the partition wall in such a manner as to be substantially surrounded by the ground pattern, the IC chip can be protected from noise given from the power supply pattern by the ground pattern, and the jitter components of the oscillation wave outputted from the output terminal can be further reduced. Therefore, stable and satisfactory high-frequency oscillation utilizing overtone oscillation can be even more securely performed.

Further, the power supply pattern including the supply electrode pad for supplying a supply voltage to the IC chip is formed and the bypass capacitor connected between the power supply pattern and part of the ground pattern is arranged in the lower cavity, and the connection point of the power supply pattern and the bypass capacitor is set in vicinity of the supply electrode pad. In other word, the power supply pattern and the bypass capacitor are connected by a short path. Since the short path contributes to reduction in the influence of external noise, high-frequency noise to be superimposed onto the supply voltage can be securely removed and noise is unlikely to be superimposed again at this short path. Thus, the jitter components of the oscillation wave outputted from the output terminal of the external terminal electrodes can be further reduced. Therefore, stable and satisfactory high-frequency oscillation utilizing overtone oscillation can be more securely performed. Furthermore, since the bypass capacitor is arranged in the lower cavity, the number of external circuits formed on the printed circuit board is reduced and wiring is simpler. Therefore, a high-performance and small-size piezoelectric oscillator can be realized.

If the oscillating circuit accommodated in the lower cavity is covered by the resin in the case that the lower cavity of the container unit of the piezoelectric oscillator is open, the oscillating circuit can be protected and its humidity resistance and heat-radiating action can be improved.

If the IC chip includes the frequency divider so that the oscillation output of the piezoelectric oscillating element can be frequency-divided, one or more of outputs having a desired frequency can be obtained by frequency-dividing the oscillation output.

Further, according to the inventive piezoelectric oscillator, the ground potential can be stabilized by forming the ground pattern having a large area between the insulating layers forming the partition wall. Since the wiring pattern for the piezoelectric oscillating element is arranged in such a relationship with respect to this ground pattern as to suppress an occurrence of a parasitic capacity, no problem resulting from a floating capacity occurs, with the result that precise and stable oscillation can be performed.

If the wiring pattern for the piezoelectric oscillating element includes the monitor electrode pad for measuring a characteristic of the piezoelectric oscillating element, the characteristic of the piezoelectric oscillating element can be measured using the monitor electrode pad while suppressing an occurrence of a parasitic capacity resulting from the monitor electrode pad.

In the inventive piezoelectric oscillator, the lower cavity is partitioned into the IC cavity for accommodating the IC chip and the electronic component cavities for accommodating the electronic components by the partitioning portion, and the respective components are accommodated in the corresponding cavities. Accordingly, even if low molecular components contained in the conductive resin paste spreads on the mount surface, i.e., so-called "bleedout" occurs when the conductive resin paste or the like is applied to the device electrode pads provided on the mount surface, i.e., the bottom surface of the cavity in the operation step of mounting the electronic components in the electronic component cavities, the influence of the bleedout is avoided since the partitioning portion separates the electronic component cavities from the wiring pattern to be bonded to the IC chip by the wire. Therefore, connection reliability in wire bonding can be improved.

In the above piezoelectric oscillator, if the IC electrode pad connected with the IC chip is arranged on the partitioning portion of the lower cavity, and the IC electrode pad and the IC chip are bonded to each other via the wire, a length of connection by the wire in wire bonding can be shortened and the wire can be easily elongated. Therefore, wire bonding can be more securely performed and connection reliability can be further improved.

According to the inventive method for manufacturing the above piezoelectric oscillator, the piezoelectric oscillating element mounting step is performed prior to the component mounting step. Thus, the IC chip and the electronic components are mounted in the lower cavity of the container unit using the conductive resin paste or the like after the piezoelectric oscillating element is mounted in the upper cavity and the container unit is sealed. This can prevent external matters from the conductive resin paste from adhering to the piezoelectric oscillating element and, therefore, high-frequency oscillating utilizing overtone likely to be influenced by external matters can be made stable and satisfactory.

In the above manufacturing method, if the heat aging step of applying heat aging to the piezoelectric oscillating element to stabilize the frequency of the piezoelectric oscillating element is performed between the piezoelectric oscillating element mounting step and the component mounting step, no unnecessary heat is applied to the IC chip since heat aging is applied to the piezoelectric oscillating element before the IC chip and the like are mounted. Thus, the operation reliability of the oscillating circuit formed by the IC chip and the like can be improved, thereby enabling stable and satisfactory high-frequency oscillation utilizing overtone.

Further, since the IC chip and the other components are mounted after the heat aging step, an occurrence of the Kirkendall's void phenomenon at the interface between the electrodes of the IC chip and the connecting members (bumps and wires) can be effectively suppressed, resulting in a stable bonded state. This also contributes to the stable operation of the IC chip.

The above manufacturing method adopts such a wire bonding method that, when the IC chip accommodated in the IC cavity and the IC electrode pad arranged in the lower cavity are bonded to each other via the wire, the wire is caused to elongate in the direction substantially parallel with the ultrasonic oscillating direction of the ultrasonic bonder, thereby being bonded to the IC electrode pad, after the wire is bonded to the IC chip.

According to this method, when second bonding is applied to bond the wire to the wiring pattern after first bonding is applied to bond the wire to the electrode of the IC chip, the wire is bonded by being caused to elongate in the direction substantially parallel with the ultrasonic oscillating direction of the ultrasonic bonder and being brought into pressing contact with the wiring pattern by the capillary action as if being torn off. Accordingly, the contact area of the bonding portion is widened, thereby improving connection reliability in wire bonding.

This application is based on patent application No. 2000-289644, 2000-289645, 2000-289646, and 2000-289647 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A piezoelectric oscillator comprising:
  a container unit having a partition wall partitioning an upper cavity and a lower cavity;
  a piezoelectric oscillating element accommodated in the upper cavity;
  an IC chip and an electronic component accommodated in the lower cavity and forming an oscillating circuit;
  external terminals provided at a periphery of a bottom of the container unit and connected with the oscillating circuit;
  a jitter reducing structure for reducing jitter components of an oscillation wave outputted from an output terminal of the external terminals in the partition wall of the container unit, and
  a power supply pattern formed between the plurality of insulating layers for supplying a supply voltage to the oscillating circuit, the power supply pattern being substantially surrounded by the ground pattern,
  wherein the partition wall is formed by a plurality of insulating layers placed one over another, and a ground pattern for grounding the oscillating circuit is arranged between the plurality of insulating layers as the jitter reducing structure.

2. A piezoelectric oscillator comprising:
  a container unit having a partition wall partitioning an upper cavity and a lower cavity;
  a piezoelectric oscillating element accommodated in the upper cavity;
  an IC chip and an electronic component accommodated in the lower cavity and forming an oscillating circuit;
  external terminals provided at a periphery of a bottom of the container unit and connected with the oscillating circuit;
  a jitter reducing structure for reducing jitter components of an oscillation wave outputted from an output terminal of the external terminals in the partition wall of the container unit, and
  a power supply pattern including a supply electrode pad formed in the lower cavity for supplying a supply voltage to the IC chip; and a bypass capacitor connected between the power supply pattern and part of the ground pattern, a connection point of the power supply pattern and the bypass capacitor being set in vicinity of the supply electrode pad,
  wherein the partition wall is formed by a plurality of insulating layers placed one over another, and a ground pattern for grounding the oscillating circuit is arranged between the plurality of insulating layers as the jitter reducing structure.

3. A piezoelectric oscillator comprising:
  a container unit having a partition wall partitioning an upper cavity and a lower cavity;
  a piezoelectric oscillating element accommodated in the upper cavity;
  an IC chip and an electronic component accommodated in the lower cavity and forming an oscillating circuit;
  external terminals provided at a periphery of a bottom of the container unit and connected with the oscillating circuit; and
  a jitter reducing structure for reducing jitter components of an oscillation wave outputted from an output terminal of the external terminals in the partition wall of the container unit, and
  wherein the IC chip includes a frequency divider for frequency-dividing an oscillation output of the piezoelectric oscillating element.

4. A piezoelectric oscillator comprising:
  a container unit having a partition wall partitioning an upper cavity and a lower cavity;
  a piezoelectric oscillating element accommodated in the upper cavity;
  an IC chip and an electronic component accommodated in the lower cavity and forming an oscillating circuit;
  external terminals provided at a periphery of a bottom of the container unit and connected with the oscillating circuit; and
  a jitter reducing structure for reducing jitter components of an oscillation wave outputted from an output terminal of the external terminals in the partition wall of the container unit,
  wherein the partition wall is formed by a plurality of insulating layers placed one over another, and a ground pattern for grounding the oscillating circuit is arranged between the plurality of insulating layers as the jitter reducing structure, and
  wherein the lower cavity is partitioned into an IC cavity for accommodating the IC chip and an electronic component cavity for accommodating the electronic component by a partitioning portion.

5. A piezoelectric oscillator according to claim 4, wherein an IC electrode pad is arranged on the partitioning portion of the lower cavity, and is bonded to the IC chip via a wire.

6. A piezoelectric oscillator comprising:
  a container unit including a partition wall partitioning an upper cavity and a lower cavity;

a piezoelectric oscillating element accommodated in the upper cavity;

an IC chip and an electronic component accommodated in the lower cavity and forming an oscillating circuit; and external terminals provided at a periphery of a bottom of the container unit and connected with the oscillating circuit;

wherein the oscillating circuit oscillates utilizing an overtone of the third or higher harmonic of the piezoelectric oscillating element, wherein the partition wall is formed by a plurality of insulating layers placed one over another, and a ground pattern for grounding the oscillating circuit is arranged between the plurality of insulating layers as a jitter reducing structure.

7. A piezoelectric oscillator according to claim 6, wherein the lower cavity is partitioned into an IC cavity for accommodating the IC chip and an electronic component cavity for accommodating the electronic component by a partitioning portion.

8. A piezoelectric oscillator according to claim 7, wherein an IC electrode pad is arranged on the partitioning portion of the lower cavity, and is bonded to the IC chip via a wire.

9. A piezoelectric oscillator comprising:

a container unit including a partition wall partitioning an upper cavity and a lower cavity, the partition wall being formed by a plurality of insulating layers placed one over another;

a piezoelectric oscillating element accommodated in the upper cavity;

an IC chip and an electronic component accommodated in the lower cavity and forming an oscillating circuit;

external terminals provided at a periphery of a bottom of the container unit and connected with the oscillating circuit;

a ground pattern arranged between the insulating layers for grounding the oscillating circuit; and a wiring pattern arranged on a lower principle surface of the partition wall for connecting the piezoelectric oscillating element with the oscillating circuit;

wherein the ground pattern and the wiring pattern are arranged in such a relationship as to suppress occurrence of a parasitic capacity.

10. A piezoelectric oscillator according to claim 9, wherein the ground pattern and the wiring pattern are arranged via an insulating layer of the partition wall in such a small overlapping area as to suppress occurrence of a parasitic capacity.

11. A piezoelectric oscillator according to claim 10, wherein the wiring pattern includes a monitor electrode pad for measuring a characteristic of the piezoelectric oscillating element.

12. A piezoelectric oscillator according to claim 9, wherein the lower cavity is partitioned into an IC cavity for accommodating the IC chip and an electronic component cavity for accommodating the electronic component by a partitioning portion.

13. A piezoelectric oscillator according to claim 12, wherein an IC electrode pad is arranged on the partitioning portion of the lower cavity, and is bonded to the IC chip via a wire.

14. A method for manufacturing a piezoelectric oscillator, comprising the steps of:

forming a container unit having a partition wall partitioning an upper cavity and a lower cavity;

mounting a piezoelectric oscillating element in the upper cavity; and mounting an IC chip and an electronic component in the lower cavity, and wherein the container unit is formed to further have a partition portion partitioning the lower cavity into an IC cavity for accommodating the IC chip and an electronic component cavity for accommodating the electronic component, and an IC electrode pad is arranged on the partition portion, further comprising steps of:

bonding a wire to the IC chip accommodated in the IC cavity; and bonding the wire to the IC electrode pad by elongating the wire in a direction substantially parallel with an ultrasonic oscillating direction of an ultrasonic bonder.

* * * * *